(12) United States Patent
Ebiko et al.

(10) Patent No.: US 12,176,373 B2
(45) Date of Patent: Dec. 24, 2024

(54) LIGHT RECEIVING ELEMENT, RANGING MODULE, AND ELECTRONIC APPARATUS

(71) Applicant: Sony Semiconductor Solutions Corporation, Kanagawa (JP)

(72) Inventors: Yoshiki Ebiko, Kanagawa (JP); Koji Neya, Kanagawa (JP); Takuya Sano, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/244,789

(22) Filed: Sep. 11, 2023

(65) Prior Publication Data

US 2023/0420479 A1 Dec. 28, 2023

Related U.S. Application Data

(63) Continuation of application No. 17/409,254, filed on Aug. 23, 2021, now Pat. No. 11,764,246, which is a (Continued)

(30) Foreign Application Priority Data

Jul. 18, 2018 (JP) .................... 2018-135395

(51) Int. Cl.
H01L 27/146 (2006.01)
G01S 7/486 (2020.01)
G01S 17/10 (2020.01)

(52) U.S. Cl.
CPC .......... *H01L 27/1464* (2013.01); *G01S 7/486* (2013.01); *G01S 17/10* (2013.01);
(Continued)

(58) Field of Classification Search
CPC ........... H01L 27/1464; H01L 27/14603; H01L 27/14623; H01L 27/14629;
(Continued)

(56) References Cited

U.S. PATENT DOCUMENTS 6,486,467 B1 * 11/2002 Speckbacher ...... G01D 5/34715
250/237 G
7,695,131 B2 * 4/2010 Yun .................... B65H 7/14
347/14
(Continued)

FOREIGN PATENT DOCUMENTS

CN 101688915 3/2010
CN 102917185 2/2013
(Continued)

OTHER PUBLICATIONS

Komazawa et al., "A Time-of-Flight Range Image Sensor Using High-Speed 4-Tap Lock-in Pixels," Selected Papers from the 31st International Congress on High-Speed Imaging and Photonics, Proceedings of SPIE, vol. 10328, No. 1032806, Feb. 20, 2017, 5 pages.
(Continued)

*Primary Examiner* — Vu A Vu
(74) *Attorney, Agent, or Firm* — SHERIDAN ROSS P.C.

(57) ABSTRACT

Disclosed is a light receiving element including an on-chip lens, a wiring layer, and a semiconductor layer disposed between the on-chip lens and the wiring layer. The semiconductor layer includes a photodiode, a first transfer transistor that transfers electric charge generated in the photodiode to a first charge storage portion, a second transfer transistor that transfers electric charge generated in the photodiode to a second charge storage portion, and an interpixel separation portion that separates the semiconductor layers of adjacent pixels from each other, for at least part of the semiconductor layer in the depth direction. The wiring layer has at least one layer including a light blocking member. The light blocking member is disposed to overlap with the photodiode in a plan view.

18 Claims, 26 Drawing Sheets

Related U.S. Application Data continuation of application No. 17/144,490, filed on Jan. 8, 2021, now Pat. No. 11,538,845, which is a continuation of application No. 16/878,458, filed on May 19, 2020, now Pat. No. 11,049,896, and a continuation of application No. 16/878,486, filed on May 19, 2020, now Pat. No. 11,018,178, which is a continuation of application No. 16/504,961, filed on Jul. 8, 2019, now Pat. No. 11,114,490, said application No. 16/878,458 is a continuation of application No. 16/504,961, filed on Jul. 8, 2019, now Pat. No. 11,114,490.

(52) U.S. Cl.
CPC .. *H01L 27/14603* (2013.01); *H01L 27/14623* (2013.01); *H01L 27/14629* (2013.01); *H01L 27/14634* (2013.01); *H01L 27/14636* (2013.01); *H01L 27/14649* (2013.01); *H01L 27/1469* (2013.01); *H01L 27/14627* (2013.01)

(58) Field of Classification Search
CPC ......... H01L 27/14634; H01L 27/14636; H01L 27/14649; H01L 27/1469; H01L 27/14627; G01S 7/486; G01S 17/10
USPC ....................................................... 365/5.01
See application file for complete search history.

(56) References Cited

U.S. PATENT DOCUMENTS

| | | | |
|---|---|---|---|
| 8,188,421 B2 * | 5/2012 | Hane .................. | G01D 5/38 250/237 G |
| 8,299,554 B2 * | 10/2012 | Adkisson .......... | H01L 27/14625 257/431 |
| 8,421,134 B2 | 4/2013 | Jeon et al. | |
| 8,633,557 B2 * | 1/2014 | Kim .................. | H01L 27/14689 257/E31.127 |
| 8,792,087 B2 * | 7/2014 | Spickermann ......... | G01S 17/10 356/5.01 |
| 8,964,081 B2 * | 2/2015 | Ohkubo .............. | H01L 27/1464 348/308 |
| 9,054,003 B2 * | 6/2015 | Ahn .................... | H01L 27/1463 |
| 9,502,450 B2 * | 11/2016 | Yanagita ............. | H01L 27/1461 |
| 9,608,030 B2 | 3/2017 | Horikoshi | |
| 9,749,558 B2 * | 8/2017 | Liu ..................... | G01T 1/20184 |
| 10,515,992 B2 * | 12/2019 | Kim .................. | H01L 27/14645 |
| 11,018,178 B2 | 5/2021 | Ebiko et al. | |
| 11,049,896 B2 | 6/2021 | Ebiko et al. | |
| 11,114,490 B2 | 9/2021 | Ebiko et al. | |
| 11,538,845 B2 | 12/2022 | Ebiko et al. | |
| 2005/0168608 A1 | 8/2005 | Fossum | |
| 2009/0114919 A1 | 5/2009 | Kawahito et al. | |
| 2009/0230437 A1 | 9/2009 | Kawahito et al. | |
| 2010/0123771 A1 | 5/2010 | Moon et al. | |
| 2013/0070131 A1 | 3/2013 | Ohkubo et al. | |
| 2014/0054662 A1 | 2/2014 | Yanagita et al. | |
| 2014/0151531 A1 | 6/2014 | Yamashita | |
| 2015/0115291 A1 | 4/2015 | Kim et al. | |
| 2016/0104733 A1 | 4/2016 | Sato et al. | |
| 2016/0211306 A1 * | 7/2016 | Choi .................. | H01L 27/1464 |
| 2017/0343653 A1 | 11/2017 | Weinberg | |
| 2018/0033809 A1 | 2/2018 | Tayanaka et al. | |
| 2018/0074196 A1 | 3/2018 | Weinberg | |
| 2018/0156899 A1 | 6/2018 | Yamada et al. | |
| 2019/0229141 A1 | 7/2019 | Kim et al. | |
| 2020/0204753 A1 | 6/2020 | Sugizaki | |
| 2021/0384235 A1 | 12/2021 | Ebiko et al. | |

FOREIGN PATENT DOCUMENTS

| | | |
|---|---|---|
| CN | 103000644 | 3/2013 |
| CN | 103403869 | 11/2013 |
| CN | 104347657 | 2/2015 |
| CN | 105938841 | 9/2016 |
| CN | 106449668 | 2/2017 |
| CN | 107431075 | 12/2017 |
| EP | 2166373 | 3/2010 |
| JP | 2001-237409 | 8/2001 |
| JP | 2003-031785 | 1/2003 |
| JP | 2008-227450 | 9/2008 |
| JP | 2008-306160 | 12/2008 |
| JP | 2009047658 A | 3/2009 |
| JP | 2010-016114 | 1/2010 |
| JP | 2010-087369 | 4/2010 |
| JP | 2010-219339 | 9/2010 |
| JP | 2011-086904 | 4/2011 |
| JP | 2012-049289 | 3/2012 |
| JP | 2012-164870 | 8/2012 |
| JP | 2012-209542 | 10/2012 |
| JP | 2013-033896 | 2/2013 |
| JP | 2013-055159 | 3/2013 |
| JP | 2013-065688 | 4/2013 |
| JP | 2013-157422 | 8/2013 |
| JP | 2013-175494 | 9/2013 |
| JP | 2014-112580 | 6/2014 |
| JP | 2015-029054 | 2/2015 |
| JP | 2016-015430 | 1/2016 |
| JP | 2017-022259 | 1/2017 |
| JP | 2018006989 A | 1/2018 |
| JP | 2018-041965 | 3/2018 |
| JP | 2018-046039 | 3/2018 |
| JP | 2018-098495 | 6/2018 |
| KR | 10-2010-0004064 | 1/2010 |
| KR | 10-2017-0017803 | 2/2017 |
| TW | 201330613 | 7/2013 |
| WO | WO 2013/115075 | 8/2013 |
| WO | WO 2014/054662 | 4/2014 |
| WO | WO 2017/086180 | 5/2017 |
| WO | WO 2017/126329 | 7/2017 |
| WO | WO 2017/169479 | 10/2017 |

OTHER PUBLICATIONS

Partial European Search Report for European Patent Application No. 19185055.1, dated Mar. 3, 2020, 15 pages.

Extended European Search Report for European Patent Application No. 19185055.1, dated Jun. 26, 2020, 14 pages.

Official Action (with English translation) for Japan Patent Application No. 2018-135395, dated Jun. 20, 2023, 9 pages.

Official Action for U.S. Appl. No. 16/504,961, dated Jul. 20, 2020, 5 pages. Restriction Requirement.

Official Action for U.S. Appl. No. 16/504,961, dated Aug. 3, 2020, 8 pages.

Notice of Allowance for U.S. Appl. No. 16/504,961, dated May 10, 2021, 7 pages.

Notice of Allowance for U.S. Appl. No. 16/504,961, dated Jun. 21, 2021, 5 pages.

Official Action for U.S. Appl. No. 16/878,458, dated Jul. 20, 2020, 6 pages. Restriction Requirement.

Official Action for U.S. Appl. No. 16/878,458, dated Aug. 24, 2020, 10 pages.

Notice of Allowance for U.S. Appl. No. 16/878,458, dated Oct. 30, 2020, 10 pages.

Notice of Allowance for U.S. Appl. No. 16/878,458, dated Feb. 23, 2021, 8 pages.

Official Action for U.S. Appl. No. 16/878,486, dated Jul. 13, 2020, 5 pages. Restriction Requirement.

Official Action for U.S. Appl. No. 16/878,486, dated Sep. 23, 2020, 12 pages.

Notice of Allowance for U.S. Appl. No. 16/878,486, dated Nov. 16, 2020, 10 pages.

Notice of Allowance for U.S. Appl. No. 16/878,486, dated Jan. 22, 2021, 9 pages.

Official Action for U.S. Appl. No. 17/144,490, dated Feb. 22, 2022, 15 pages.

Official Action for U.S. Appl. No. 17/144,490, dated Jun. 9, 2022, 9 pages.

(56) References Cited

OTHER PUBLICATIONS

Notice of Allowance for U.S. Appl. No. 17/144,490, dated Aug. 23, 2022, 8 pages.
Corrected Notice of Allowance for U.S. Appl. No. 17/144,490, dated Oct. 14, 2022, 4 pages.
Corrected Notice of Allowance for U.S. Appl. No. 17/144,490, dated Nov. 2, 2022, 4 pages.
Official Action for U.S. Appl. No. 17/409,254, dated Oct. 17, 2022, 22 pages.
Official Action for U.S. Appl. No. 17/409,254, dated Feb. 3, 2023, 13 pages.
Notice of Allowance for U.S. Appl. No. 17/409,254, dated Apr. 18, 2023, 7 pages.
Corrected Notice of Allowance for U.S. Appl. No. 17/409,254, dated Aug. 14, 2023, 4 pages.

* cited by examiner

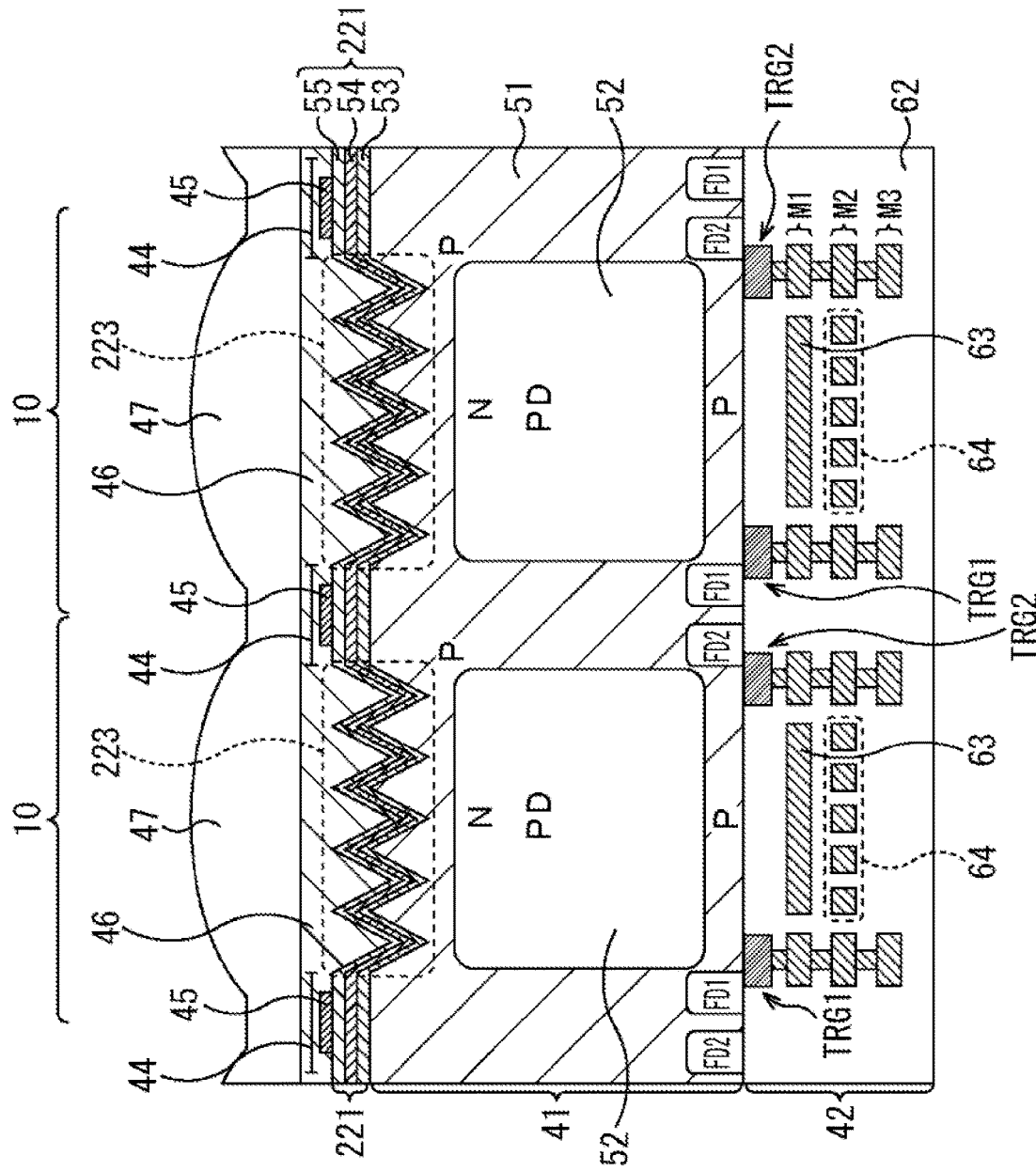

LIGHT RECEIVING ELEMENT, RANGING MODULE, AND ELECTRONIC APPARATUS

CROSS REFERENCE TO RELATED APPLICATIONS

This application is a continuation of and claims priority to U.S. patent application Ser. No. 17/409,254, filed Aug. 23, 2021, now U.S. Pat. No. 11,764,246, which is a continuation of and claims priority to U.S. patent application Ser. No. 17/144,490, filed Jan. 8, 2021, now U.S. Pat. No. 11,538,845, which is a continuation of and claims priority to U.S. patent application Ser. No. 16/878,458, filed May 19, 2020, now U.S. Pat. No. 11,049,896, and of U.S. patent application Ser. No. 16/878,486, filed May 19, 2020, now U.S. Pat. No. 11,018,178, which are continuations of and claim priority to U.S. patent application Ser. No. 16/504,961, filed Jul. 8, 2019, now U.S. Pat. No. 11,114,490, which claims the benefit of Japanese Priority Patent Application JP 2018-135395, filed on Jul. 18, 2018, the entire disclosures of each of which are incorporated herein by reference.

TECHNICAL FIELD

The present technology relates to a light receiving element, a ranging module, and an electronic apparatus, and more particularly, to a light receiving element, a ranging module, and an electronic apparatus that are designed to be capable of improving characteristics.

BACKGROUND ART

Ranging systems using an indirect time of flight (ToF) method have been known. In such a ranging system, signal charges obtained by receiving reflected light of active light that is emitted from a light emitting diode (LED) or a laser at a certain phase and is reflected by an object are distributed to different regions at high speed. Therefore, a sensor capable of the distribution is necessary.

In view of this, a technology has been suggested for enabling high-speed modulation of a wide region in a substrate of a sensor by applying voltage directly to the substrate and thus generating electric current in the substrate, for example (see PTL 1, for example). Such a sensor is also called a current assisted photonic demodulator (CAPD) sensor.

CITATION LIST

Patent Literature

[PTL 1]
JP 2011-86904 A

SUMMARY

Technical Problem

However, it is difficult to obtain a CAPD sensor with sufficient characteristics by the above described technology. For example, the above described CAPD sensor is a surface-illuminated sensor in which wiring lines and the like are disposed on the surface of the substrate on the side on which light from outside is received.

To secure the photoelectric conversion region, it is desirable that there is no wiring line or the like that blocks the light path of incident light on the light receiving surface side of a photodiode (PD) or a photoelectric conversion portion. In a surface-illuminated CAPD sensor, however, wiring lines for extracting charges, various kinds of control lines, and signal lines are disposed on the light receiving surface side of a PD, depending on the structure. As a result, the photoelectric conversion region is limited. That is, it is difficult to secure a sufficient photoelectric conversion region, and characteristics such as the pixel sensitivity might be degraded.

Further, in a case where a CAPD sensor is used in a place subjected to external light, the external light component becomes a noise component in the indirect ToF method in which ranging is performed with active light. Therefore, to secure a sufficient signal-to-noise ratio (SN ratio) and obtain distance information, it is necessary to secure a sufficient saturation signal amount (Qs). In a surface-illuminated CAPD sensor, however, there is a limitation on the wiring layout, and therefore, it is necessary to take a measure to use a technique not involving a wiring capacitor, such as providing an additional transistor for securing capacitance.

In many cases, near-infrared light of a wavelength of about 940 nm, which corresponds to a window of sunlight, is used as the light source. Near-infrared light has low quantum efficiency because the absorption coefficient of the silicon forming a semiconductor layer is low. Therefore, it is necessary to increase the thickness of the silicon forming the photoelectric conversion region. In a case where the silicon is thick, charges subjected to photoelectric conversion take a long time to reach the electrode for attracting the charges. After the distribution is switched, some charges reach the electrode in some cases, resulting in an erroneous signal. As a result, the ranging accuracy might become lower. In other words, the characteristics of the sensor might be degraded.

The present technology has been made in view of those circumstances, and is to enable improvement in the characteristics of a ToF sensor.

Solution to Problem

A light receiving element according to a first aspect of the present technology includes:
an on-chip lens;
a wiring layer; and
a semiconductor layer disposed between the on-chip lens and the wiring layer,
in which the semiconductor layer includes:
a photodiode;
a first transfer transistor that transfers electric charge generated in the photodiode to a first charge storage portion;
a second transfer transistor that transfers electric charge generated in the photodiode to a second charge storage portion; and
an interpixel separation portion that separates the semiconductor layers of adjacent pixels from each other, for at least part of the semiconductor layer in the depth direction,
the wiring layer has at least one layer including a light blocking member, and
the light blocking member is disposed to overlap with the photodiode in a plan view.

In the first aspect of the present technology, an on-chip lens, a wiring layer, and a semiconductor layer disposed between the on-chip lens and the wiring layer are provided. The semiconductor layer includes: a photodiode; a first transfer transistor that transfers electric charge generated in the photodiode to a first charge storage portion; a second transfer transistor that transfers electric charge generated in the photodiode to a second charge storage portion; and an interpixel separation portion that separates the semiconductor layers of adjacent pixels from each other, for at least part of the semiconductor layer in the depth direction. The wiring layer includes at least one layer including a light blocking member, and the light blocking member is provided to overlap with the photodiode in a plan view.

A ranging module according to a second aspect of the present technology includes:

a light receiving member;

a light source that emits irradiation light having periodically varying brightness; and a light emission controller that controls timing to emit the irradiation light, in which the light receiving element includes:

an on-chip lens;

a wiring layer; and a semiconductor layer disposed between the on-chip lens and the wiring layer, the semiconductor layer includes:

a photodiode;

a first transfer transistor that transfers electric charge generated in the photodiode to a first charge storage portion;

a second transfer transistor that transfers electric charge generated in the photodiode to a second charge storage portion; and an interpixel separation portion that separates the semiconductor layers of adjacent pixels from each other, for at least part of the semiconductor layer in the depth direction, the wiring layer has at least one layer including a light blocking member, and the light blocking member is disposed to overlap with the photodiode in a plan view.

In the second aspect of the present technology, a light receiving element, a light source that emits irradiation light having periodically varying brightness, and a light emission controller that controls the timing to emit the irradiation light are provided. In the light receiving element, an on-chip lens, a wiring layer, and a semiconductor layer disposed between the on-chip lens and the wiring layer are provided. The semiconductor layer includes: a photodiode; a first transfer transistor that transfers electric charge generated in the photodiode to a first charge storage portion; a second transfer transistor that transfers electric charge generated in the photodiode to a second charge storage portion; and an interpixel separation portion that separates the semiconductor layers of adjacent pixels from each other, for at least part of the semiconductor layer in the depth direction. The wiring layer includes at least one layer including a light blocking member, and the light blocking member is provided to overlap with the photodiode in a plan view.

An electronic apparatus according to a third aspect of the present technology includes:

a ranging module including:

a light receiving member;

a light source that emits irradiation light having periodically varying brightness; and a light emission controller that controls timing to emit the irradiation light, in which the light receiving element includes:

an on-chip lens;

a wiring layer; and a semiconductor layer disposed between the on-chip lens and the wiring layer, the semiconductor layer includes:

a photodiode;

a first transfer transistor that transfers electric charge generated in the photodiode to a first charge storage portion;

a second transfer transistor that transfers electric charge generated in the photodiode to a second charge storage portion; and an interpixel separation portion that separates the semiconductor layers of adjacent pixels from each other, for at least part of the semiconductor layer in the depth direction, the wiring layer has at least one layer including a light blocking member, and the light blocking member is disposed to overlap with the photodiode in a plan view.

In the third aspect of the present technology, a ranging module including a light receiving element, a light source that emits irradiation light having periodically varying brightness, and a light emission controller that controls the timing to emit the irradiation light is provided. In the light receiving element, an on-chip lens, a wiring layer, and a semiconductor layer disposed between the on-chip lens and the wiring layer are provided. The semiconductor layer includes: a photodiode; a first transfer transistor that transfers electric charge generated in the photodiode to a first charge storage portion; a second transfer transistor that transfers electric charge generated in the photodiode to a second charge storage portion; and an interpixel separation portion that separates the semiconductor layers of adjacent pixels from each other, for at least part of the semiconductor layer in the depth direction. The wiring layer includes at least one layer including a light blocking member, and the light blocking member is provided to overlap with the photodiode in a plan view.

Advantageous Effects of Invention

According to the first through third aspects of the present technology, characteristics can be improved.

Note that the effects of the present technology are not limited to the effects described herein, and may include any of the effects described in the present disclosure.

BRIEF DESCRIPTION OF DRAWINGS

FIG. 15 is a cross-sectional view showing a fifth example configuration of pixels.

DESCRIPTION OF EMBODIMENTS

Figure 1:
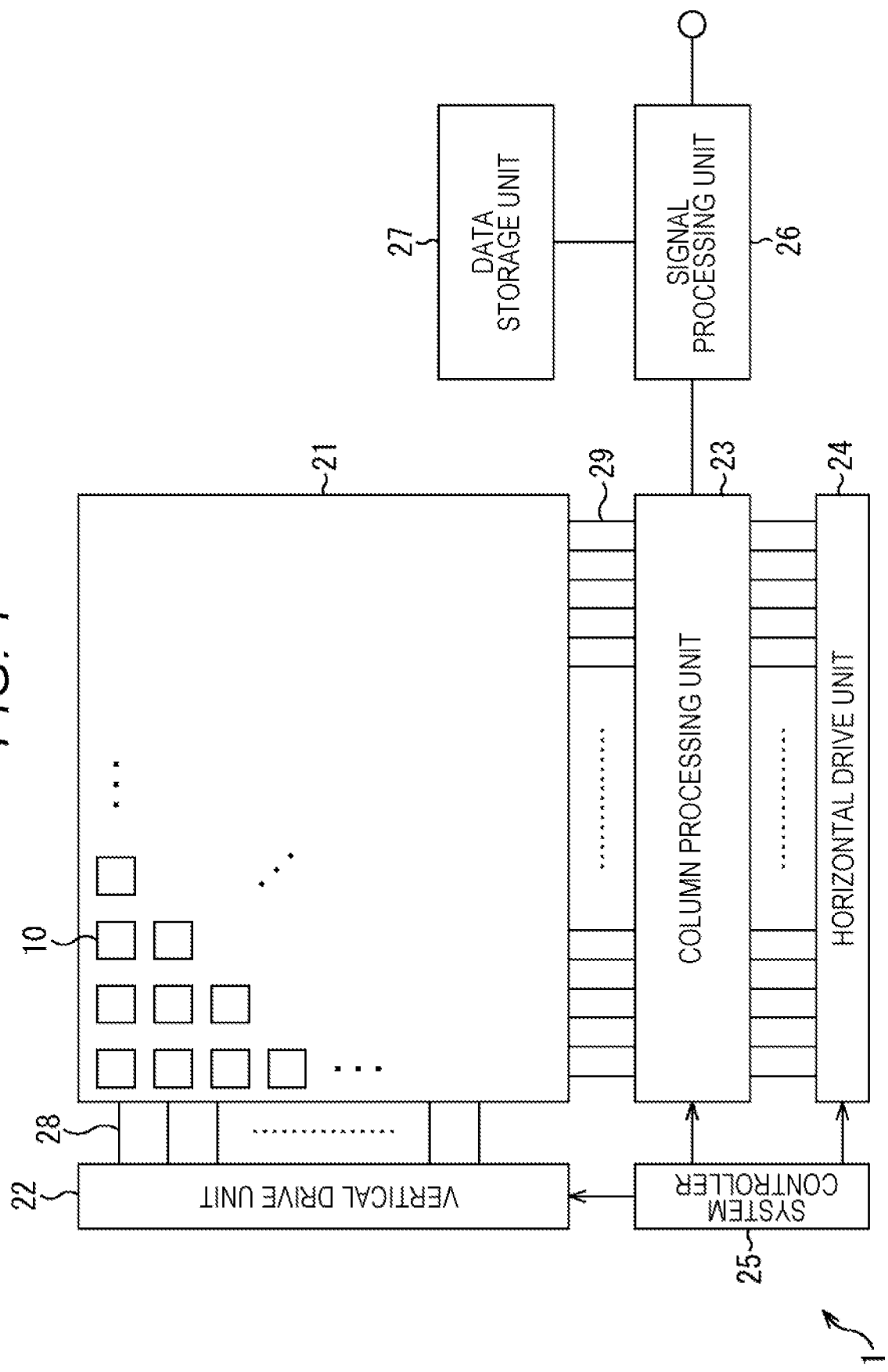
FIG. 1 is a block diagram schematically showing an example configuration of a light receiving element to which an embodiment of the present technology is applied.

The following is descriptions of modes (hereinafter referred to as embodiments) for carrying out the present technology. Note that explanation will be made in the following order.

1. Example configuration of a light receiving element
2. Cross-sectional view of a first example configuration of pixels
3. Example circuit configuration of a pixel
4. Plan view of a pixel
5. Another example circuit configuration of a pixel
6. Plan view of a pixel
7. Effects of a back-illuminated type
8. Cross-sectional view of a second example configuration of pixels
9. Cross-sectional view of a third example configuration of pixels
10. Cross-sectional view of a fourth example configuration of pixels
11. Cross-sectional view of a fifth example configuration of pixels
12. Cross-sectional view of a sixth example configuration of pixels
13. Example of a four-tap pixel configuration
14. Example configuration of a ranging module
15. Example configuration of an electronic apparatus
16. Example applications to moving objects

1. Example Configuration of a Light Receiving Element

FIG. 1 is a block diagram schematically showing an example configuration of a light receiving element to which the present technology is applied.

A light receiving element 1 shown in FIG. 1 is an element that outputs ranging information according to the indirect ToF method.

The light receiving element 1 receives light (reflected light) that is light (irradiation light) emitted from a predetermined light source has been incident on and then reflected by an object, and outputs a depth image in which information indicating the distance to the object is stored as a depth value. Note that the irradiation light emitted from the light source is infrared light having a wavelength of 780 nm to 1000 nm, for example, and is pulse light that repeatedly turns on and off at predetermined intervals.

The light receiving element 1 includes a pixel array unit 21 formed on a semiconductor substrate (not shown), and a peripheral circuit unit integrated on the same semiconductor substrate as the pixel array unit 21. The peripheral circuit unit is formed with a vertical drive unit 22, a column processing unit 23, a horizontal drive unit 24, and a system control unit 25, for example.

The light receiving element 1 further includes a signal processing unit 26 and a data storage unit 27. Note that the signal processing unit 26 and the data storage unit 27 may be mounted on the same substrate as the light receiving element 1, or may be disposed on a substrate in a module different from the light receiving element 1. The pixel array unit 21 generates charges corresponding to the amount of received light, and pixels 10 that output signals corresponding to the charges are two-dimensionally arranged in the row direction and the column direction in a matrix fashion. In other words, the pixel array unit 21 has a plurality of pixels 10 that photoelectrically convert incident light, and output signals corresponding to the resultant charges. The pixel 10 will be described later in detail, with reference to FIG. 2 and the subsequent drawings.

Here, the row direction refers to the array direction of the pixels 10 in the horizontal direction, and the column direction refers to the array direction of the pixels 10 in the vertical direction. The row direction is the lateral direction in the drawing, and the column direction is the longitudinal direction in the drawing.

In the matrix-like pixel array of the pixel array unit 21, pixel drive lines 28 are arranged in the row direction for the respective pixel rows, and two vertical signal lines 29 are arranged in the column direction for each pixel column. For example, the pixel drive lines 28 transmit drive signals for performing driving when signals are read from the pixels 10. Note that, in FIG. 1, each pixel drive line 28 is shown as one wiring line, but is not necessarily one wiring line. One end of each of the pixel drive lines 28 is connected to the output end of the vertical drive unit 22 corresponding to the respective rows.

The vertical drive unit 22 is formed with a shift register, an address decoder, and the like, and drives the respective pixels 10 in the pixel array unit 21 collectively or row by row, for example. In other words, the vertical drive unit 22, together with the system control unit 25 that controls the vertical drive unit 22, forms a drive unit that controls operations of the respective pixels 10 in the pixel array unit 21.

Detection signals output from the respective pixels 10 in the pixel row according to the drive control performed by the vertical drive unit 22 are input to the column processing unit 23 through the vertical signal lines 29 The column processing unit 23 performs predetermined signal processing on the detection signals output from the respective pixels 10 through the vertical signal lines 29, and temporarily stores the detection signals subjected to the signal processing.

Specifically, the column processing unit 23 performs a noise removal process, an analog-to-digital (AD) conversion process, and the like as the signal processing.

The horizontal drive unit 24 is formed with a shift register, an address decoder, and the like, and sequentially selects the unit circuits corresponding to the pixel columns of the column processing unit 23.

Through this selective scanning performed by the horizontal drive unit 24, the detection signals subjected to the signal processing by the column processing unit 23 for the respective unit circuits are sequentially output. The system control unit 25 includes a timing generator that generates various timing signals, and performs drive control on the vertical drive unit 22, the column processing unit 23, the horizontal drive unit 24, and the like, on the basis of the various timing signals generated by the timing generator.

The signal processing unit 26 has at least an arithmetic processing function, and performs various kinds of signal processing such as arithmetic processing, on the basis of the detection signals that are output from the column processing unit 23. The data storage unit 27 temporarily stores the data necessary for the signal processing to be performed by the signal processing unit 26.

The light receiving element 1 configured as described above outputs a depth image in which information indicating the distance to the object is stored as a depth value in a pixel value. The light receiving element 1 is mounted on a vehicle, for example, and may be mounted on an in-vehicle system that measures the distance to an object outside the vehicle, a gesture recognition device that measures the distance to an object such as the user's hand and recognizes a gesture of the user from the result of the measurement, or the like.

2. Cross-Sectional View of a First Example Configuration of Pixels

Figure 2:
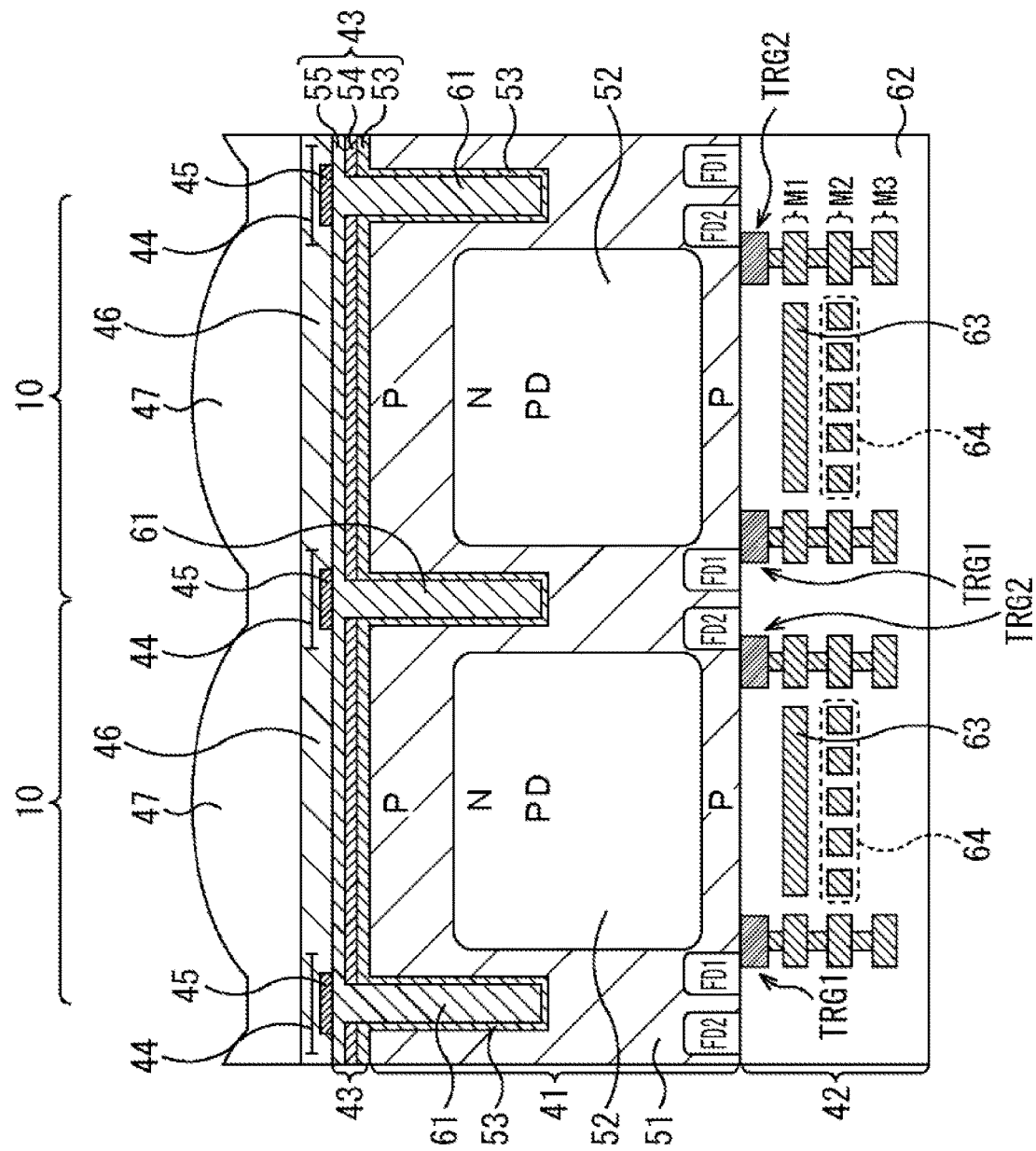
FIG. 2 is a cross-sectional view showing a first example configuration of pixels.

FIG. 2 is a cross-sectional view showing a first example configuration of the pixels 10 arranged in the pixel array unit 21.

The light receiving element 1 includes a semiconductor substrate 41 and a multilayer wiring layer 42 formed on the front surface side (the lower side in the drawing). The semiconductor substrate 41 is formed with silicon (Si), for example, and has a thickness of 1 to 6 µm, for example. In the semiconductor substrate 41, N-type (a second conductivity type) semiconductor regions 52 are formed pixel by pixel in a P-type (a first conductivity type) semiconductor region 51, for example, so that photodiodes PD are formed on a pixel-by-pixel basis. The P-type semiconductor region 51 provided on both the front and back surfaces of the semiconductor substrate 41 also serves as a hole charge storage region for reducing dark current.

The upper surface of the semiconductor substrate 41, which is the upper side in FIG. 2, is the back surface of the semiconductor substrate 41, and is a light incident surface through which light enters. An antireflective film 43 is formed on the upper surface on the back surface side of the semiconductor substrate 41.

The antireflective film 43 has a stack structure in which a fixed charge film and an oxide film are stacked, for example, and a high-dielectric-constant (high-k) insulating thin film formed by atomic layer deposition (ALD), for example, may be used as the antireflective film 43. Specifically, hafnium oxide ($HfO_2$), aluminum oxide ($Al_2O_3$), titanium oxide ($TiO_2$), strontium titan oxide (STO), or the like may be used. In the example illustrated in FIG. 2, the antireflective film 43 is formed with a hafnium oxide film 53, an aluminum oxide film 54, and a silicon oxide film 55 that are stacked. Interpixel light blocking films 45 that prevent incident light from entering adjacent pixels are formed on the upper surface of the antireflective film 43 and at the boundary portions 44 (hereinafter also referred to as the pixel boundary portions 44) between the pixels 10 adjacent to one another in the semiconductor substrate 41. The material of the interpixel light blocking films 45 may be any material that blocks light, and it is possible to use a metal material such as tungsten (W), aluminum (Al), or copper (Cu), for example.

On the upper surface of the antireflective film 43 and the upper surfaces of the interpixel light blocking films 45, a planarization film 46 is formed with an insulating film of silicon oxide ($SiO_2$), silicon nitride (SiN), silicon oxynitride (SiON), or the like, or an organic material such as resin, for example.

Further, on-chip lenses 47 are formed on the upper surfaces of the planarization film 46 for the respective pixels. For example, the on-chip lenses 47 are formed with a resin material such as styrene resin, acrylic resin, styrene-acrylic copolymer resin, or siloxane resin. The light gathered by the on-chip lenses 47 is efficiently made to enter the photodiode PD.

Further, at the pixel boundary portions 44 on the back surface side of the semiconductor substrate 41, interpixel separation portions 61 that separate adjacent pixels from one another are formed in the depth direction of the semiconductor substrate 41, to reach a predetermined depth in the substrate depth direction from the back surface side of the semiconductor substrate 41 (on the side of the on-chip lenses 47). The outer peripheral portions including the bottom and side walls of the interpixel separation portions 61 are covered with the hafnium oxide film 53, which is part of the antireflective film 43. The interpixel separation portions 61 prevent incident light from reaching the adjacent pixels 10, and confine the incident light in the respective pixels. The interpixel separation portions 61 also prevent leakage of incident light from the adjacent pixels 10.

In the example illustrated in FIG. 2, the silicon oxide film 55, which is the material of the uppermost layer of the antireflective film 43, is buried in trenches (grooves) dug from the back surface side, so that the silicon oxide film 55 and the interpixel separation portions 61 are simultaneously formed. Accordingly, the silicon oxide film 55, which is part of the stack film serving as the antireflective film 43, is formed with the same material as the interpixel separation portions 61, but is not necessarily formed with the same material. The material to be buried as the interpixel separation portions 61 in the trenches (grooves) dug from the back surface side may be a metal material such as tungsten (W), aluminum (Al), titanium (Ti), or titanium nitride (TiN), for example.

Meanwhile, on the front surface side of the semiconductor substrate 41 on which the multilayer wiring layer 42 is formed, two transfer transistors TRG1 and TRG2 are formed for the one photodiode PD formed in each pixel 10.

Further, on the front surface side of the semiconductor substrate 41, floating diffusion regions FD1 and FD2 as charge storage portions that temporarily hold the charges transferred from the photodiodes PD are formed with high-concentration N-type semiconductor regions (N-type diffusion regions).

The multilayer wiring layer 42 includes a plurality of metal films M and an interlayer insulating film 62 between the metal films M. FIG. 2 shows an example in which the metal films M include three layers: a first metal film M1 through a third metal film M3.

Of the plurality of metal films M in the multilayer wiring layer 42, a region of the first metal film M1 closest to the semiconductor substrate 41 and located below the formation region of each photodiode PD, or the region overlapping at least part of the formation region of each photodiode PD in plan view, has a metal wiring line of copper, aluminum, or the like formed as a light blocking member 63.

The light blocking member 63 blocks infrared light that has entered the semiconductor substrate 41 from the light incident surface via the on-chip lens 47, and passed through the semiconductor substrate 41 without being photoelectrically converted in the semiconductor substrate 41, with the first metal film M1 closest to the semiconductor substrate 41, so that the infrared light does not reach the second metal film M2 and the third metal film M3 located below the first metal film M1. By virtue of this light blocking function, the infrared light that has not been photoelectrically converted in the semiconductor substrate 41 and has passed through the semiconductor substrate 41 is prevented from being scattered by the metal films M below the first metal film M1 and entering the neighboring pixels. Thus, it is possible to prevent erroneous light detection at the neighboring pixels.

Further, the light blocking members 63 also has a function to reflect infrared light that has entered the semiconductor substrate 41 from the light incident surface via the on-chip lenses 47 and passed through the semiconductor substrate 41 without being photoelectrically converted in the semiconductor substrate 41, so that the infrared light reenters the semiconductor substrate 41. In view of this, the light blocking members 63 may also be regarded as reflective members. With this reflective function, the amount of infrared light to be photoelectrically converted in the semiconductor substrate 41 can be increased, and the quantum efficiency (QE), which is the sensitivity of the pixels 10 to infrared light, can be improved.

Note that the light blocking members 63 may also form a structure that reflects or blocks light with polysilicon, an oxide film, or the like, other than a metal material. Further, each light blocking member 63 may not be formed with a single metal film M, but may be formed with a plurality of metal films M, such as a grid-like structure formed with the first metal film M1 and the second metal film M2, for example.

Of the plurality of metal films M in the multilayer wiring layer 42, a predetermined metal film M, such as the second metal film M2, has wiring capacitors 64 that are patterns formed in a comb-like shape, for example. The light blocking members 63 and the wiring capacitors 64 may be formed in the same layer (metal film M). In a case where the light blocking members 63 and the wiring capacitors 64 are formed in different layers, however, the wiring capacitors 64 formed in a layer farther from the semiconductor substrate 41 than the light blocking members 63. In other words, the light blocking members 63 are formed closer to the semiconductor substrate 41 than the wiring capacitors 64.

As described above, the light receiving element 1 has a back-illuminated structure in which the semiconductor substrate 41 that is a semiconductor layer is disposed between the on-chip lenses 47 and the multilayer wiring layer 42, and incident light is made to enter the photodiodes PD from the back surface side on which the on-chip lenses 47 are formed.

Further, the pixels 10 each include two transfer transistors TRG1 and TRG2 for the photodiode PD provided in each pixel, and are designed to be capable of distributing charges (electrons) generated through photoelectric conversion performed by the photodiode PD to the floating diffusion region FD1 or FD2.

Furthermore, the pixels 10 in the first example configuration have the interpixel separation portions 61 formed at the pixel boundary portions 44, to prevent incident light from reaching the adjacent pixels 10, and prevent leakage of incident light from the adjacent pixels 10 while confining the incident light in the respective pixels. The light blocking members 63 are then formed in a metal film M below the formation regions of the photodiodes PD, so that infrared light that has passed through the semiconductor substrate 41 without being photoelectrically converted in the semiconductor substrate 41 is reflected by the light blocking members 63 and is made to reenter the semiconductor substrate 41. With the above configuration, the amount of infrared light to be photoelectrically converted in the semiconductor substrate 41 can be increased, and the quantum efficiency (QE), which is the sensitivity of the pixels 10 to infrared light, can be improved.

3. Example Circuit Configuration of a Pixel

Figure 3:
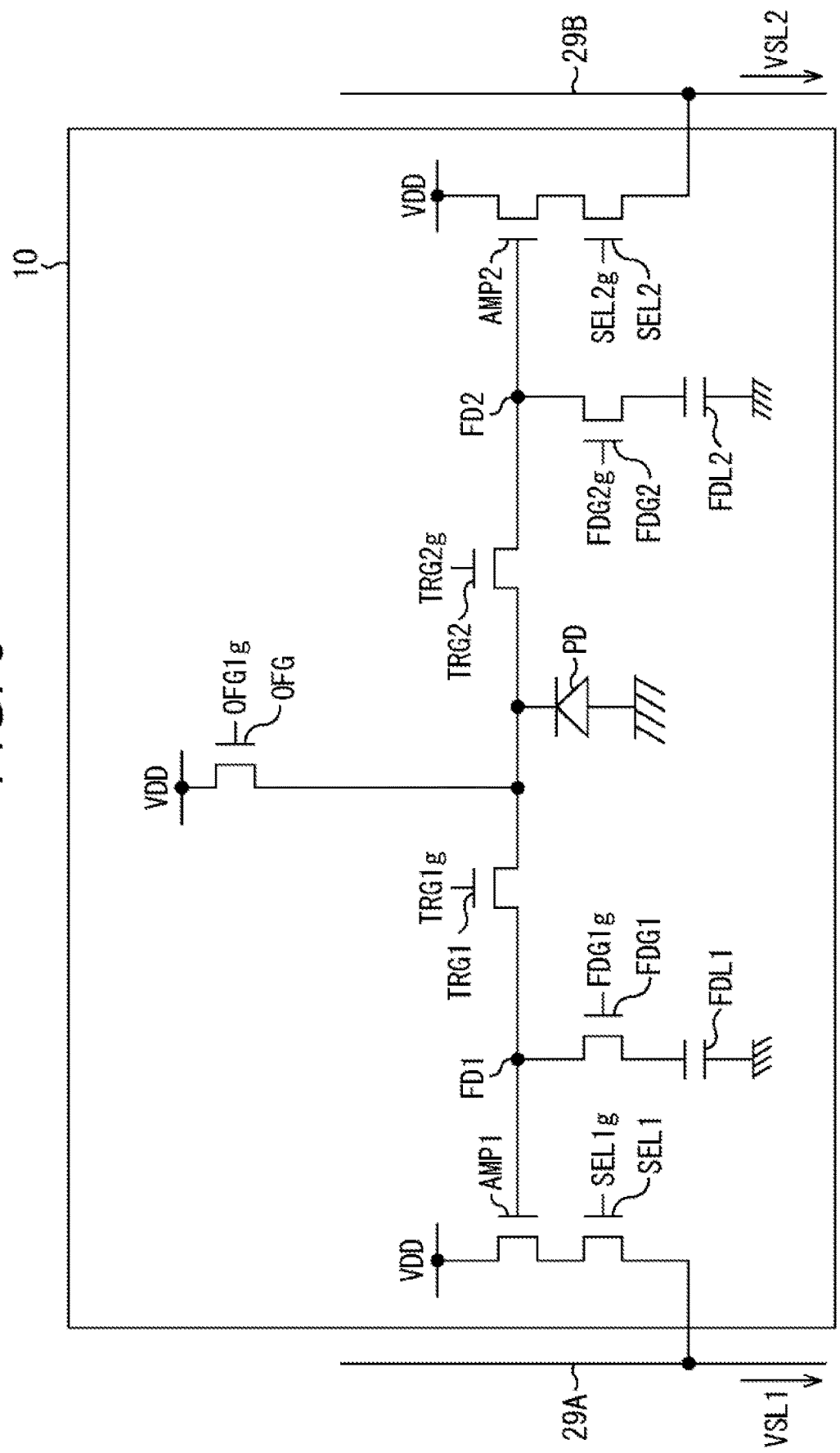
FIG. 3 is a diagram showing an example circuit configuration of each pixel shown in FIG. 2.

FIG. 3 shows the circuit configuration of each of the pixels 10 two-dimensionally arranged in the pixel array unit 21.

A pixel 10 includes a photodiode PD as a photoelectric conversion element. The pixel 10 also includes two sets of a transfer transistor TRG, a floating diffusion region FD, an additional capacitor FDL, a switch transistor FDG, an amplification transistor AMP, a reset transistor RST, and a selection transistor SEL. The pixel 10 further includes a charge ejection transistor OFG.

Here, in a case where the two sets of a transfer transistor TRG, a floating diffusion region FD, an additional capacitor FDL, a switch transistor FDG, an amplification transistor AMP, a reset transistor RST, and a selection transistor SEL are distinguished from each other in the pixel 10, the transistors are referred to as transfer transistors TRG1 and TRG2, floating diffusion regions FD1 and FD2, additional capacitors FDL1 and FDL2, switch transistors FDG1 and FDG2, amplification transistors AMP1 and AMP2, reset transistors RST1 and RST2, and selection transistors SEL1 and SEL2, as shown in FIG. 3.

The transfer transistors TRG, the switch transistors FDG, the amplification transistors AMP, the selection transistors SEL, the reset transistors RST, and the charge ejection transistor OFG include N-type MOS transistors, for example.

When a transfer drive signal TRG1$g$ supplied to the gate electrode of the transfer transistor TRG1 enters an active state, the transfer transistor TRG1 enters a conductive state, to transfer the charges accumulated in the photodiode PD to the floating diffusion region FD1. When a transfer drive signal TRG2$g$ supplied to the gate electrode of the transfer transistor TRG2 enters an active state, the transfer transistor TRG2 enters a conductive state, to transfer the charges accumulated in the photodiode PD to the floating diffusion region FD2. The floating diffusion regions FD1 and FD2 are charge storage portions that temporarily hold the charge transferred from the photodiode PD.

When an FD drive signal FDG1$g$ supplied to the gate electrode of the switch transistor FDG1 enters an active state, the switch transistor FDG1 enters a conductive state, to connect the additional capacitor FDL1 to the floating diffusion region FD1. When an FD drive signal FDG2$g$ supplied to the gate electrode of the switch transistor FDG2 enters an active state, the switch transistor FDG2 enters a conductive state, to connect the additional capacitor FDL2 to the floating diffusion region FD2. The additional capacitors FDL1 and FDL2 are formed with the wiring capacitor 64 shown in FIG. 2. When a reset drive signal RSTg supplied to the gate electrode of the reset transistor RST1 enters an active state, the reset transistor RST1 enters a conductive state, to reset the potential of the floating diffusion region FD1. When a reset drive signal RSTg supplied to the gate electrode of the reset transistor RST2 enters an active state, the reset transistor RST2 enters a conductive state, to reset the potential of the floating diffusion region FD2. Note that, when the reset transistors RST1 and RST2 are made to enter an active state, the switch transistors FDG1 and FDG2 are also made to enter an active state at the same time, and further, the additional capacitors FDL1 and FDL2 are reset.

For example, at a high-illuminance time at which the amount of incident light is large, the vertical drive unit 22 causes the switch transistors FDG1 and FDG2 to enter an active state, to connect the floating diffusion region FD1 and the additional capacitor FDL1, and connect the floating diffusion region FD2 and the additional capacitor FDL2. Thus, more charges can be accumulated at a high-illuminance time.

At a low-illuminance time at which the amount of incident light is small, on the other hand, the vertical drive unit 22 causes the switch transistors FDG1 and FDG2 to enter an inactive state, to disconnect the additional capacitors FDL1 and FDL2 from the floating diffusion regions FD1 and FD2, respectively. Thus, conversion efficiency can be increased.

When an ejection drive signal OFG1g supplied to the gate electrode of the charge ejection transistor OFG enters an active state, the charge ejection transistor OFG enters a conductive state, to eject the charges accumulated in the photodiode PD.

When the source electrode of the amplification transistor AMP1 is connected to a vertical signal line 29A via the selection transistor SEL1, the amplification transistor AMP1 is connected to a constant current source (not shown), to form a source follower circuit. When the source electrode of the amplification transistor AMP2 is connected to a vertical signal line 29B via the selection transistor SEL2, the amplification transistor AMP2 is connected to a constant current source (not shown), to form a source follower circuit.

The selection transistor SEL1 is connected between the source electrode of the amplification transistor AMP1 and the vertical signal line 29A. When a selection signal SEL1g supplied to the gate electrode of the selection transistor SEL1 enters an active state, the selection transistor SEL1 enters a conductive state, to output a detection signal VSL1 output from the amplification transistor AMP1 to the vertical signal line 29A.

The selection transistor SEL2 is connected between the source electrode of the amplification transistor AMP2 and the vertical signal line 29B. When a selection signal SEL2g supplied to the gate electrode of the selection transistor SEL2 enters an active state, the selection transistor SEL2 enters a conductive state, to output a detection signal VSL2 output from the amplification transistor AMP2 to the vertical signal line 29B.

The transfer transistors TRG1 and TRG2, the switch transistors FDG1 and FDG2, the amplification transistors AMP1 and AMP2, the selection transistors SEL1 and SEL2, and the charge ejection transistor OFG of the pixel 10 are controlled by the vertical drive unit 22.

In the pixel circuit shown in FIG. 2, the additional capacitors FDL1 and FDL2, and the switch transistors FDG1 and FDG2 that control connection of the additional capacitors FDL1 and FDL2 may be omitted. However, as the additional capacitors FDL are provided and are appropriately used depending on the amount of incident light, a high dynamic range can be secured.

Operation of the pixel 10 is now briefly described. First, before light reception is started, a reset operation for resetting the charges in the pixel 10 is performed in all the pixels. Specifically, the charge ejection transistor OFG, the reset transistors RST1 and RST2, and the switch transistors FDG1 and FDG2 are turned on, and the stored charges in the photodiode PD, the floating diffusion regions FD1 and FD2, and the additional capacitors FDL1 and FDL2 are ejected.

After the stored charges are ejected, light reception is started in all the pixels.

During the light reception period, the transfer transistors TRG1 and TRG2 are alternately driven.

Specifically, during a first period, control is performed, to turn on the transfer transistor TRG1, and turn off the transfer transistor TRG2. During the first period, the charges generated in the photodiode PD are transferred to the floating diffusion region FD1. During a second period following the first period, control is performed, to turn off the transfer transistor TRG1, and turn on the transfer transistor TRG2. During the second period, the charges generated in the photodiode PD are transferred to the floating diffusion region FD2. As a result, the charges generated in the photodiode PD are distributed to the floating diffusion regions FD1 and FD2, and are accumulated therein.

Here, the transfer transistor TRG and the floating diffusion region FD from which charges (electrons) obtained through photoelectric conversion are read out are also referred to as the active tap. Conversely, the transfer transistor TRG and the floating diffusion region FD from which no charges obtained through photoelectric conversion are read out are also referred to as the inactive tap.

When the light reception period comes to an end, the respective pixels 10 in the pixel array unit 21 are then selected in the order of the lines. In the selected pixel 10, the selection transistors SEL1 and SEL2 are turned on. As a result, the charges accumulated in the floating diffusion region FD1 are output as the detection signal VSL1 to the column processing unit 23 via the vertical signal line 29A. The charges accumulated in the floating diffusion region FD2 are output as the detection signal VSL2 to the column processing unit 23 via the vertical signal line 29B.

One light receiving operation is completed in the above manner, and the next light receiving operation starting from a reset operation is then performed.

The reflected light to be received by the pixel 10 is delayed from the time when the light source emitted light, in accordance with the distance to the object.

Since the distribution ratio between the charges accumulated in the two floating diffusion regions FD1 and FD2 varies depending on the delay time corresponding to the distance to the object, the distance to the object can be calculated from the distribution ratio between the charges accumulated in the two floating diffusion regions FD1 and FD2.

4. Plan View of a Pixel

Figure 4:
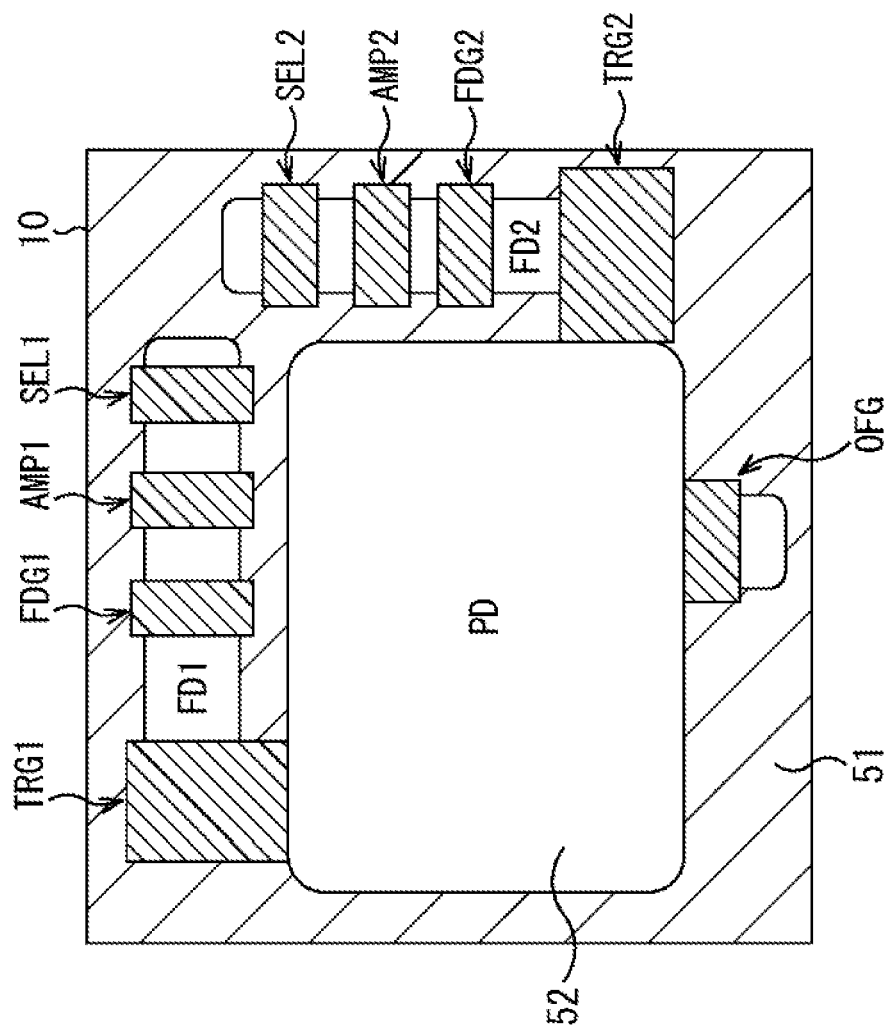
FIG. 4 is a plan view showing an example of arrangement in the pixel circuit shown in FIG. 3.

FIG. 4 is a plan view showing an example of arrangement in the pixel circuit shown in FIG. 3.

The lateral direction in FIG. 4 corresponds to the row direction (horizontal direction) in FIG. 1, and the longitudinal direction corresponds to the column direction (vertical direction) in FIG. 1.

As shown in FIG. 4, the photodiode PD is formed with an N-type semiconductor region 52 in the central region of the rectangular pixel 10.

Outside the photodiode PD, the transfer transistor TRG1, the switch transistor FDG1, the reset transistor RST1, the amplification transistor AMP1, and the selection transistor SEL1 are linearly arranged along a predetermined side of the four sides of the rectangular pixel 10, and the transfer transistor TRG2, the switch transistor FDG2, the reset transistor RST2, the amplification transistor AMP2, and the selection transistor SEL2 are linearly arranged along another side of the four sides of the rectangular pixel 10.

Further, the charge ejection transistor OFG is disposed along a side different from the two sides of the pixel 10 along which the transfer transistors TRG, the switch transistors FDG, the reset transistors RST, the amplification transistors AMP, and the selection transistors SEL are formed.

Note that the arrangement in the pixel circuit shown in FIG. 3 is not limited to this example, and may be some other arrangement.

5. Another Example Circuit Configuration of a Pixel

Figure 5:
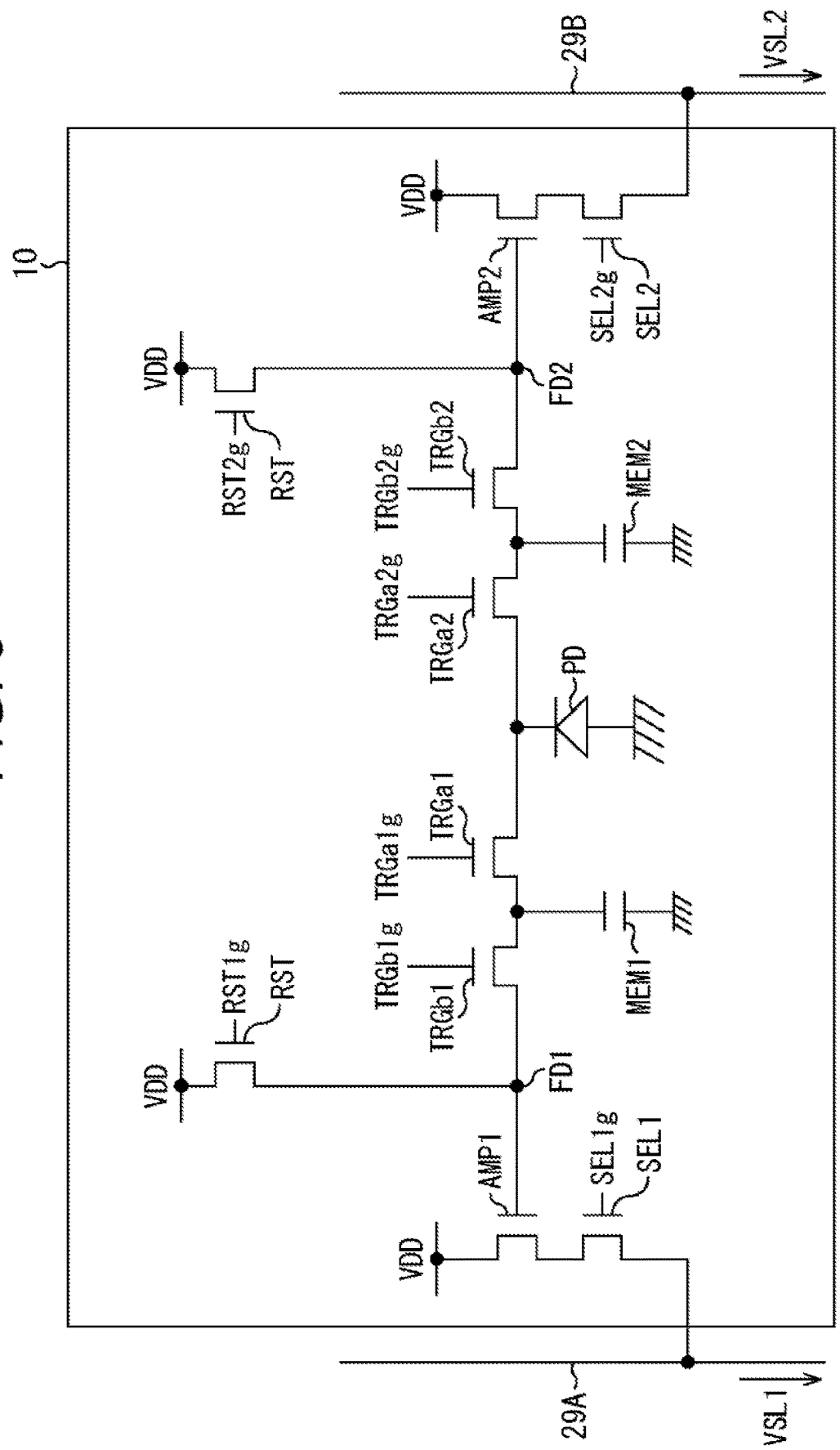
FIG. 5 is a diagram showing another example circuit configuration of each pixel shown in FIG. 2.

FIG. 5 shows another example circuit configuration of each pixel 10.

In FIG. 5, the components equivalent to those shown in FIG. 3 are denoted by the same reference numerals as those used in FIG. 3, and explanation of the components will not be repeated below.

A pixel 10 includes a photodiode PD as a photoelectric conversion element. The pixel 10 also includes two sets of a first transfer transistor TRGa, a second transfer transistor TRGb, a memory MEM, a floating diffusion region FD, a reset transistor RST, an amplification transistor AMP, and a selection transistor SEL.

Here, in a case where the two sets of a first transfer transistor TRGa, a second transfer transistor TRGb, a memory MEM, a floating diffusion region FD, a reset transistor RST, an amplification transistor AMP, and a selection transistor SEL are distinguished from each other in the pixel 10, the transistors are referred to as first transfer transistors TRGa1 and TRGa2, second transfer transistors TRGb1 and TRGb2, transfer transistors TRG1 and TRG2, memories MEM1 and MEM2, floating diffusion regions FD1 and FD2, amplification transistors AMP1 and AMP2, and selection transistors SEL1 and SEL2, as shown in FIG. 5.

Accordingly, the pixel circuit in FIG. 5 differs from the pixel circuit in FIG. 3 in that the transfer transistors TRG are replaced with the two kinds transfer transistors, which are the first transfer transistors TRGa and the second transfer transistors TRGb, and the memories MEM are added. Further, the additional capacitors FDL and the switch transistors FDG are omitted.

The first transfer transistors TRGa, the second transfer transistors TRGb, the reset transistors RST, the amplification transistors AMP, and the selection transistors SEL include N-type MOS transistors, for example.

In the pixel circuit shown in FIG. 3, charges generated in the photodiode PD are transferred to and held in the floating diffusion regions FD1 and FD2. In the pixel circuit in FIG. 5, on the other hand, charges generated in the photodiode PD are transferred to and held in the memories MEM1 and MEM2 provided as charge storage portions.

Specifically, when a first transfer drive signal TRGa1$g$ supplied to the gate electrode of the first transfer transistor TRGa1 enters an active state, the first transfer transistor TRGa1 enters a conductive state, to transfer the charges accumulated in the photodiode PD to the memory MEM1. When a first transfer drive signal TRGa2$g$ supplied to the gate electrode of the first transfer transistor TRGa2 enters an active state, the first transfer transistor TRGa2 enters a conductive state, to transfer the charges accumulated in the photodiode PD to the memory MEM2.

Further, when a second transfer drive signal TRGb1$g$ supplied to the gate electrode of the second transfer transistor TRGb1 enters an active state, the second transfer transistor TRGb1 enters a conductive state, to transfer the charges accumulated in the memory MEM1 to the floating diffusion region FD1. When a second transfer drive signal TRGb2$g$ supplied to the gate electrode of the second transfer transistor TRGb2 enters an active state, the second transfer transistor TRGb2 enters a conductive state, to transfer the charges accumulated in the memory MEM2 to the floating diffusion region FD2.

When a reset drive signal RST1$g$ supplied to the gate electrode of the reset transistor RST1 enters an active state, the reset transistor RST1 enters a conductive state, to reset the potential of the floating diffusion region FD1. When a reset drive signal RST2$g$ supplied to the gate electrode of the reset transistor RST2 enters an active state, the reset transistor RST2 enters a conductive state, to reset the potential of the floating diffusion region FD2. Note that, when the reset transistors RST1 and RST2 are made to enter an active state, the second transfer transistors TRGb1 and TRGb2 are also made to enter an active state at the same time, and further, the memories MEM1 and MEM2 are reset.

In the pixel circuit in FIG. 5, the charges generated in the photodiode PD are distributed to the memories MEM1 and MEM2, and are accumulated therein. At the timing of readout, the charges stored in the memories MEM1 and MEM2 are then transferred to the floating diffusion regions FD1 and FD2, respectively, and are output from the pixel 10.

6. Plan View of a Pixel

Figure 6:
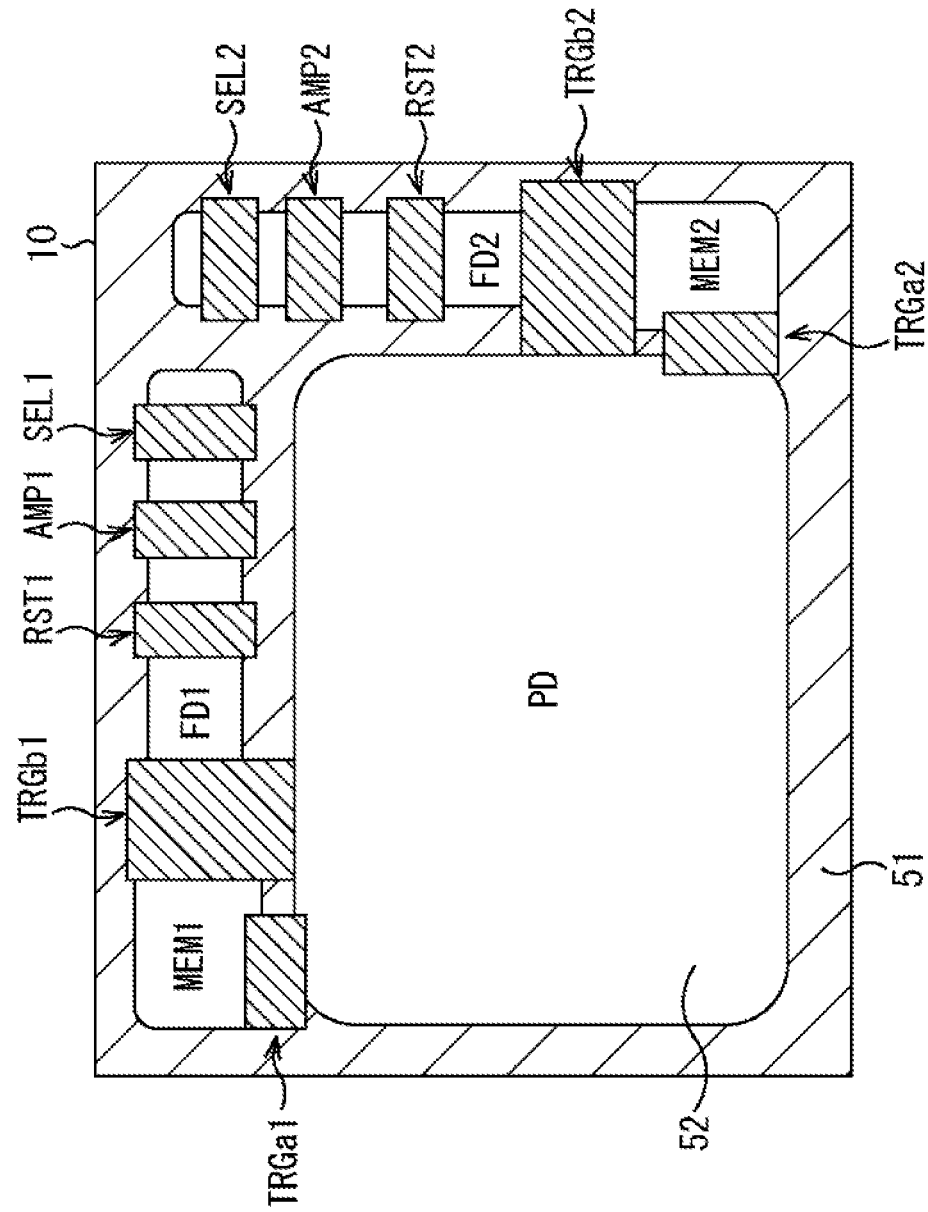
FIG. 6 is a plan view showing an example of arrangement in the pixel circuit shown in FIG. 5.

FIG. 6 is a plan view showing an example of arrangement in the pixel circuit shown in FIG. 5.

The lateral direction in FIG. 6 corresponds to the row direction (horizontal direction) in FIG. 1, and the longitudinal direction corresponds to the column direction (vertical direction) in FIG. 1.

As shown in FIG. 6, the photodiode PD is formed with an N-type semiconductor region 52 in the central region of the rectangular pixel 10.

Outside the photodiode PD, the first transfer transistor TRGa1, the second transfer transistor TRGb1, the reset transistor RST1, the amplification transistor AMP1, and the selection transistor SEL1 are linearly arranged along a predetermined side of the four sides of the rectangular pixel 10, and the first transfer transistor TRGa2, the second transfer transistor TRGb2, the reset transistor RST2, the amplification transistor AMP2, and the selection transistor SEL2 are linearly arranged along another side of the four sides of the rectangular pixel 10. The memories MEM1 and MEM2 are formed with buried N-type diffusion regions, for example.

Note that the arrangement in the pixel circuit shown in FIG. 5 is not limited to this example, and may be some other arrangement.

7. Effects of a Back-Illuminated Type

With the light receiving element 1 described above, the following effects can be achieved.

First, since the light receiving element 1 is of a back-illuminated type, quantum efficiency (QE)×aperture ratio (fill factor (FF)) can be maximized, and the ranging characteristics of the light receiving element 1 can be improved.

Figure 7:
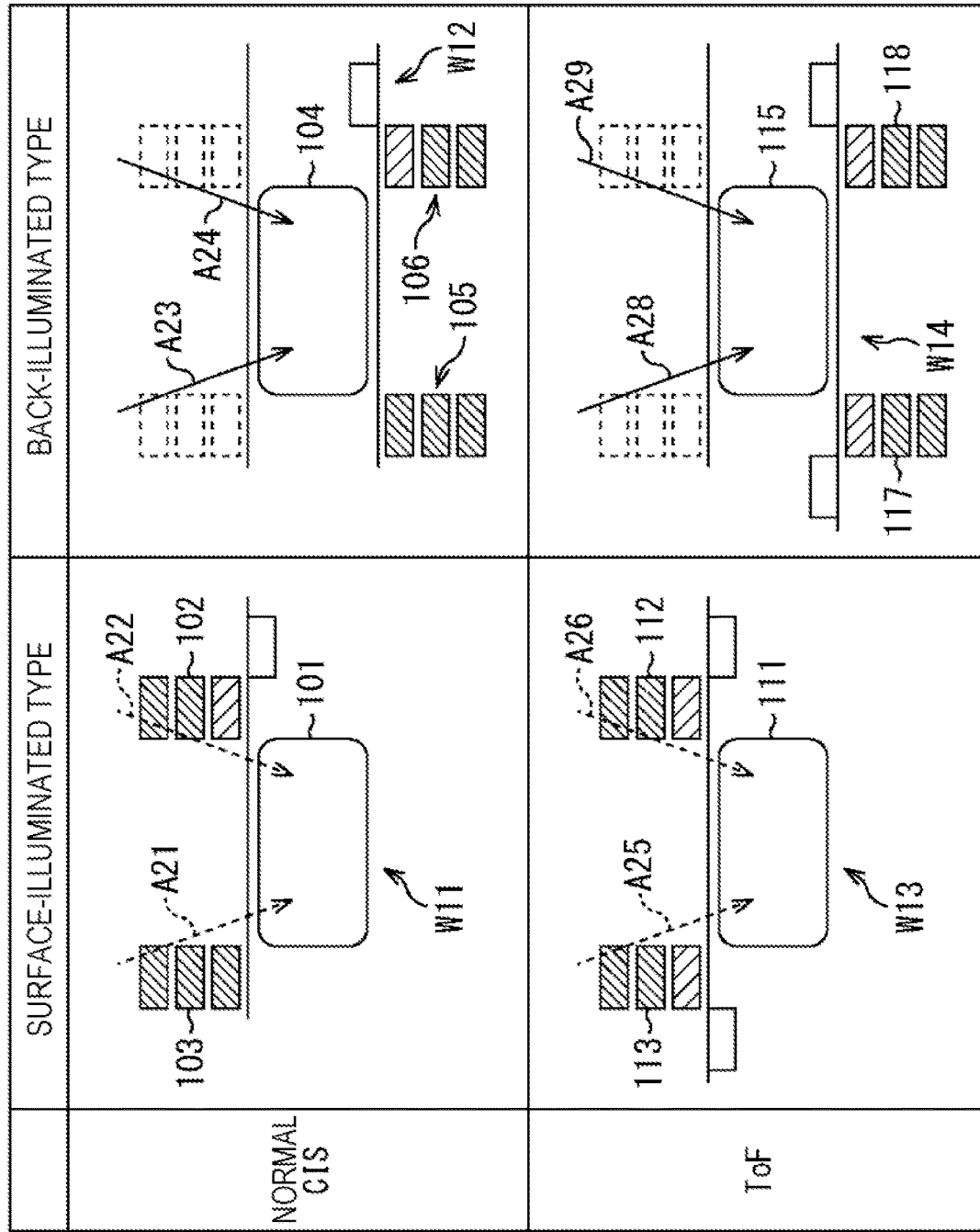
FIG. 7 is a diagram for explaining the effects of a back-illuminated type.

For example, as indicated by an arrow W11 in FIG. 7, a normal surface-illuminated image sensor has a structure in which wiring lines 102 and wiring lines 103 are formed on the light incident surface side through which light from outside enters a PD 101 that is a photoelectric conversion portion.

Therefore, part of light that obliquely enters the PD 101 from outside at a certain angle as shown by an arrow A21 and an arrow A22, for example, might be blocked by the wiring lines 102 or the wiring lines 103, and does not enter the PD 101.

On the other hand, a back-illuminated image sensor has a structure in which wiring lines 105 and wiring lines 106 are formed on the surface on the opposite side from the light incident surface through which light from outside enters a PD 104 that is a photoelectric conversion portion, as indicated by an arrow W12, for example. Accordingly, it is possible to secure a sufficient aperture ratio, compared with that in a case with a surface-illuminated type. Specifically, as indicated by an arrow A23 and an arrow A24, for example, light obliquely incident on the PD 104 at a certain angle enters the PD 104 from outside without being blocked by any wiring line. Thus, a larger amount of light can be received, and pixel sensitivity can be improved.

The pixel sensitivity improving effect achieved with such a back-illuminated type can also be achieved with the light receiving element 1, which is a back-illuminated ToF sensor.

Specifically, in the structure of a surface-illuminated ToF sensor, wiring lines 112 and wiring lines 113 are formed on the light incident surface side of a PD 111 that is a photoelectric conversion portion, as indicated by an arrow W13. Therefore, part of light that obliquely enters the PD 111 from outside at a certain angle as shown by an arrow A25 and an arrow A26, for example, might be blocked by the wiring lines 112 or the wiring lines 113 or the like, and does not enter the PD 111. On the other hand, a back-illuminated ToF sensor has a structure in which transfer transistors for reading out charges are formed on the surface on the opposite side from the light incident surface of a PD 115 that is a photoelectric conversion portion, as indicated by an arrow W14, for example. Further, wiring lines 117 and wiring lines 118 are formed on the surface on the opposite side from the light incident surface of the PD 115. With this arrangement, as indicated by an arrow A28 and an arrow A29, for example, light obliquely incident on the PD 115 at a certain angle enters the PD 115 without being blocked by any wiring line.

Accordingly, in the back-illuminated ToF sensor, a sufficient aperture ratio can be secured compared with that in a case with a surface-illuminated ToF sensor. Thus, quantum efficiency (QE)×aperture ratio (FF) can be maximized, and the ranging characteristics can be improved.

Figure 8:
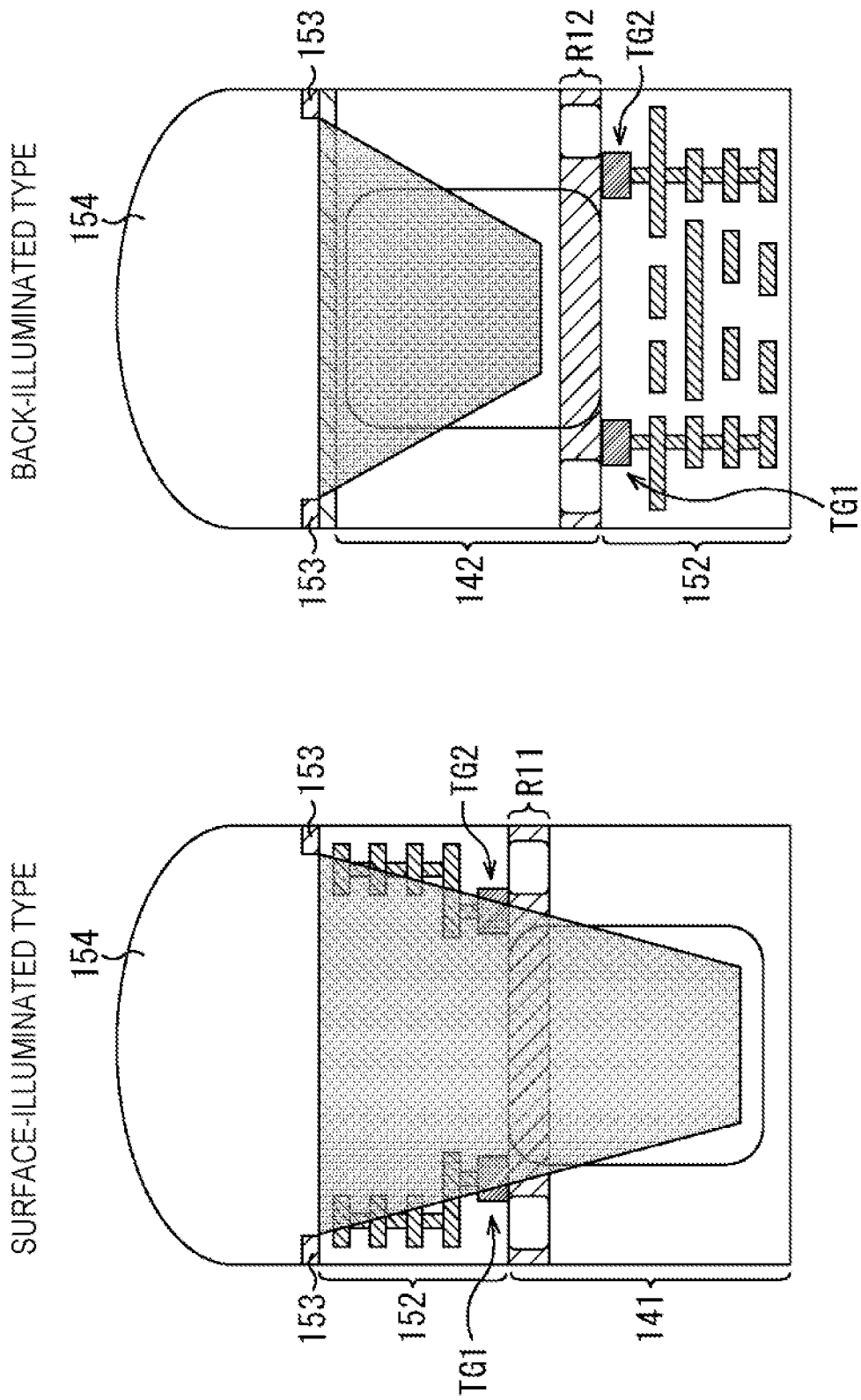
FIG. 8 is a diagram for explaining the effects of a back-illuminated type.

FIG. 8 shows cross-sectional views of pixels of a surface-illuminated ToF sensor and a back-illuminated ToF sensor.

In the surface-illuminated ToF sensor on the left side in FIG. 8, the upper side of a substrate 141 in the drawing is the light incident surface, and a wiring layer 152 including a plurality of wiring lines, an interpixel light blocking film 153, and an on-chip lens 154 are stacked on the light incident surface side of the substrate 141.

In the back-illuminated ToF sensor on the right side in FIG. 8, a wiring layer 152 including a plurality of wiring lines is formed on the lower side of a substrate 142 on the opposite side from the light incident surface in the drawing, and an interpixel light blocking film 153 and an on-chip lens 154 are stacked on the upper side of the substrate 142, which is the light incident surface side.

Note that, in FIG. 8, each shaded trapezoidal shape indicates a region in which the light intensity is high because infrared light is gathered by the on-chip lens 154.

For example, in the surface-illuminated ToF sensor, there is a region R11 in which charge readout transfer transistors TG1 and TG2 exist on the light incident surface side of the substrate 141. In the surface-illuminated ToF sensor, the intensity of infrared light is high in the region R11 near the light incident surface of the substrate 141, and accordingly, the probability of photoelectric conversion of infrared light in the region R11 is high. That is, since the amount of infrared light entering the area near the inactive tap is large, the number of signal carriers that are not detected by the active tap increases, and charge separation efficiency decreases.

In the back-illuminated ToF sensor, on the other hand, there is a region R12 in which the active tap and the inactive tap are formed at positions far from the light incident surface of the substrate 142, or at positions near the surface on the opposite side from the light incident surface side. The substrate 142 corresponds to the semiconductor substrate 41 shown in FIG. 2.

The region R12 is located at a portion of the surface on the opposite side from the light incident surface side of the substrate 142, and the region R12 is also located at a position far from the light incident surface.

Accordingly, in the vicinity of the region R12, the intensity of incident infrared light is relatively low. Signal carriers obtained through photoelectric conversion in a region in which the intensity of infrared light is high, such as a region near the center of the substrate 142 or near the light incident surface, are guided to the active tap by the electric field gradient formed by the active tap and the inactive tap, and are detected in the floating diffusion region FD of the active tap.

In the vicinity of the region R12 including the inactive tap, on the other hand, the intensity of incident infrared light is relatively low, and accordingly, the probability of photoelectric conversion of infrared light in the region R12 is low. That is, the amount of infrared light entering an area in the vicinity of the inactive tap is small. Accordingly, the number of signal carriers (electrons) that are generated through photoelectric conversion in the vicinity of the inactive tap and move to the floating diffusion region FD of the inactive tap becomes smaller, and thus, the charge separation efficiency can be improved. As a result, the ranging characteristics can be improved.

Further, in the back-illuminated light receiving element 1, the thickness of the semiconductor substrate 41 can be reduced, and thus, it is possible to increase the efficiency in extracting electrons (charges) that are signal carriers.

Figure 9:
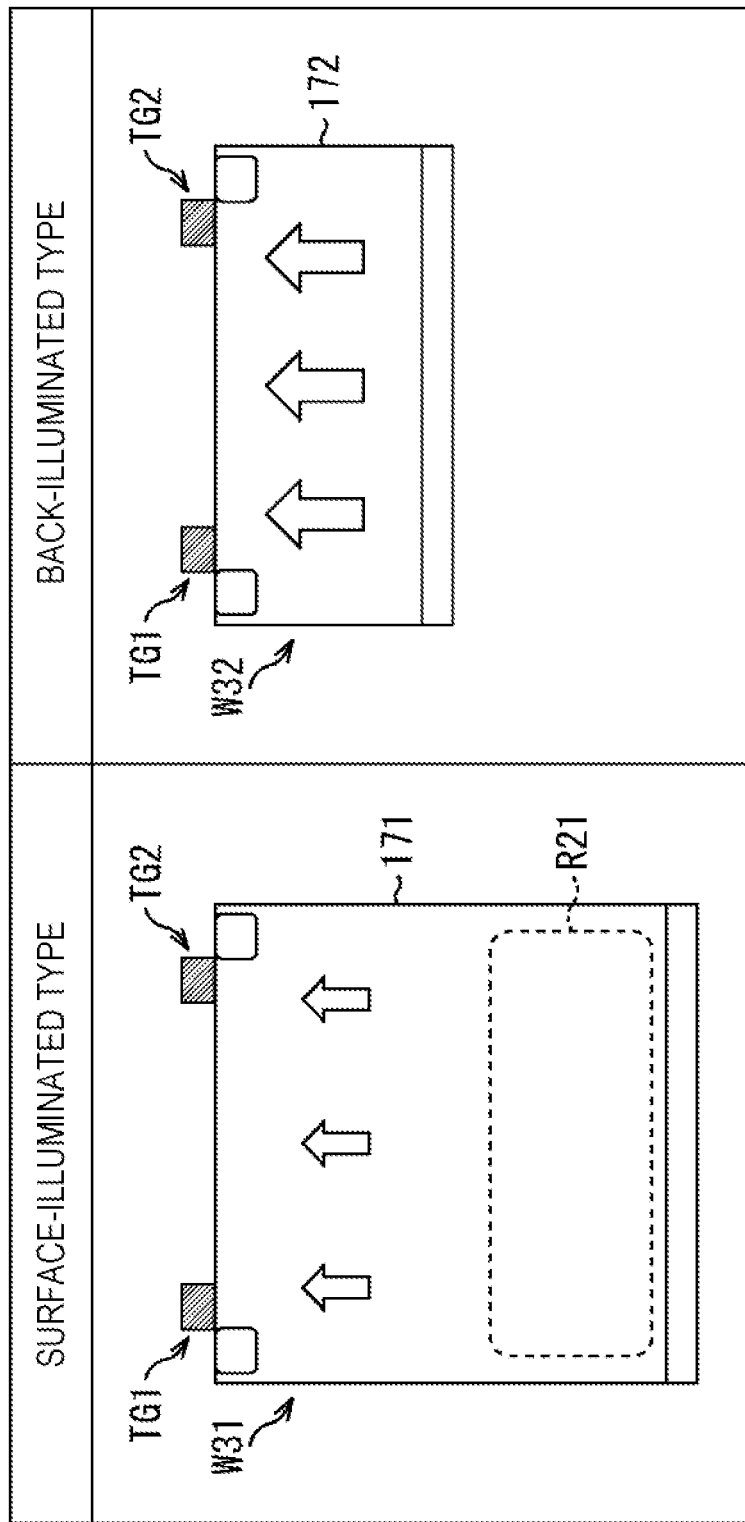
FIG. 9 is a diagram for explaining the effects of a back-illuminated type.

For example, in a surface-illuminated ToF sensor, it is difficult to secure a sufficient aperture ratio. Therefore, to secure a higher quantum efficiency and prevent a decrease in quantum efficiency×aperture ratio, there is a need to increase the thickness of a substrate 171 to a certain value, as indicated by an arrow W31 in FIG. 9.

As a result, the potential gradient becomes lower in the region near the surface on the opposite side from the light incident surface in the substrate 171, or in a region R21, for example, and the electric field in a direction perpendicular to the substrate 171 substantially becomes weaker. In this case, the moving velocity of the signal carriers becomes lower, and therefore, the time elapsing from the photoelectric conversion to the transfer of the signal carriers to the floating diffusion region FD of the active tap becomes longer. Note that, in FIG. 9, the arrows in the substrate 171 indicate the electric field in the direction perpendicular to the substrate 171 in the substrate 171.

Further, when the substrate 171 is thick, the moving distance of the signal carriers from a position far from the active tap in the substrate 171 to the floating diffusion region FD of the active tap is long.

Accordingly, at the position far from the active tap, the time elapsing from the photoelectric conversion to the transfer of the signal carriers to the floating diffusion region FD of the active tap becomes even longer.

Therefore, after switching of the transfer transistors TG is completed, some signal carriers might reach the active tap, and turn into an erroneous signal.

Figure 10:
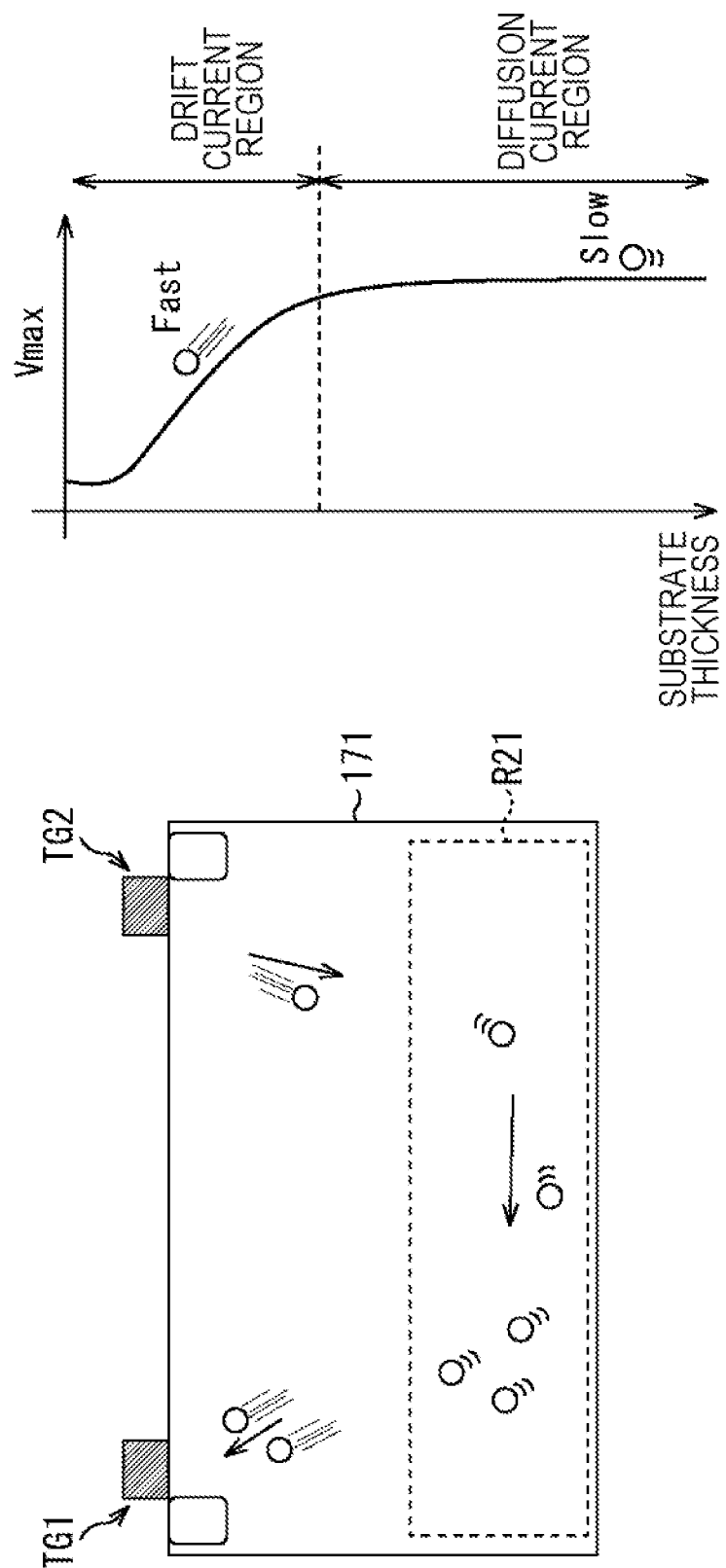
FIG. 10 is a diagram for explaining the effects of a back-illuminated type.

FIG. 10 shows the relationship between the position in the thickness direction of the substrate 171 and the moving velocity of the signal carriers. The region R21 corresponds to a diffusion current region.

In a case where the substrate 171 is thick as described above, when the drive frequency is high, or when switching between the active tap and the inactive tap is performed at high speed, for example, electrons generated at a position far from the active tap, such as the region R21, are not completely drawn into the floating diffusion region FD of the active tap. In other words, in a case where the time during which the tap is active is short, some electrons (charges) generated in the region R21 or the like are not detected in the floating diffusion region FD of the active tap, and the electron extraction efficiency becomes lower.

In the back-illuminated ToF sensor, on the other hand, a sufficient aperture ratio can be secured. Thus, even when a substrate 172 is made thinner as indicated by an arrow W32 in FIG. 9, for example, sufficient quantum efficiency× aperture ratio can be secured. Here, the substrate 172 corresponds to the semiconductor substrate 41 in FIG. 2, and the arrows in the substrate 172 indicate the electric field in a direction perpendicular to the substrate 172.

Figure 11:
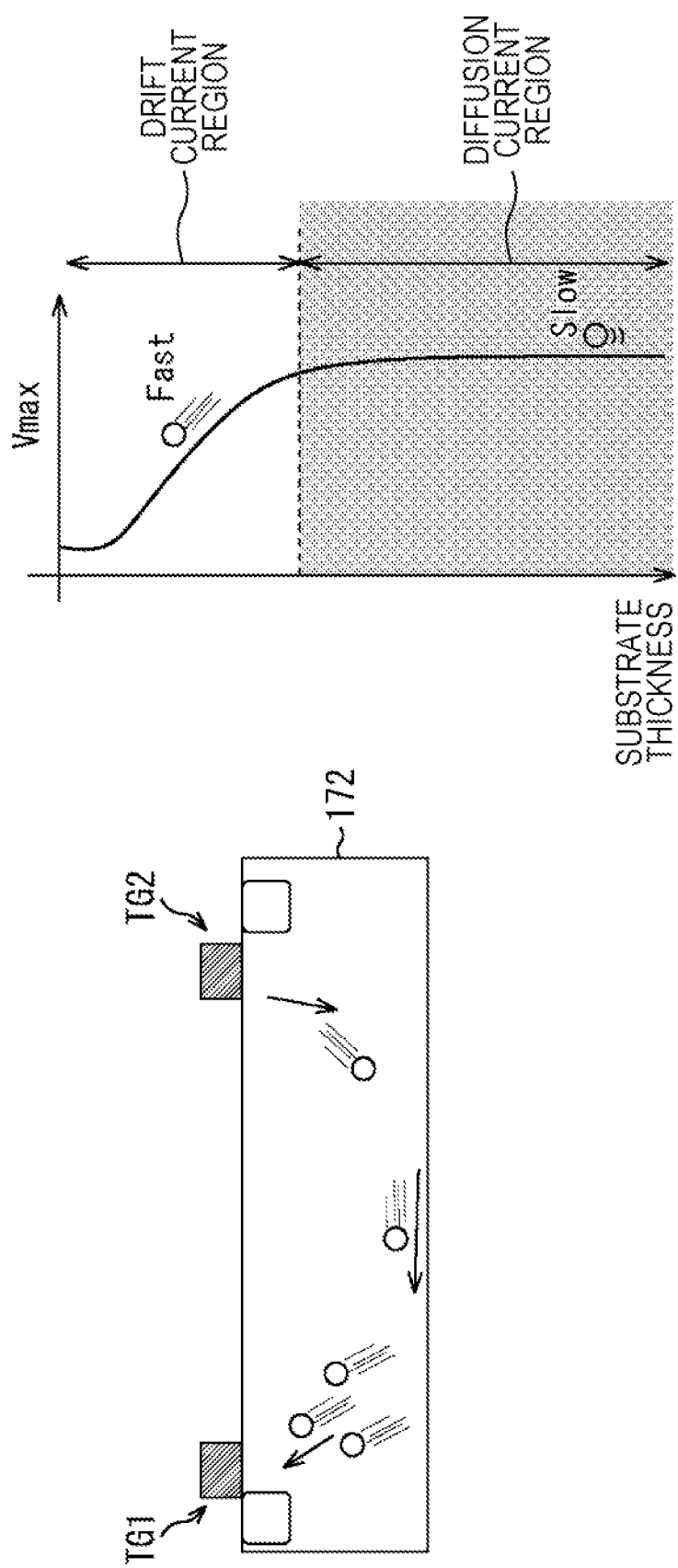
FIG. 11 is a diagram for explaining the effects of a back-illuminated type.

FIG. 11 shows the relationship between the position in the thickness direction of the substrate 172 and the moving velocity of the signal carriers.

When the thickness of the substrate 172 is reduced in this manner, the electric field in a direction perpendicular to the substrate 172 becomes substantially stronger, and only the electrons (charges) in a drift current region in which the moving velocity of the signal carriers is high are used while the electrons in the diffusion current region in which the moving velocity of the signal carriers is low are not used. As only the electrons (charges) in the drift current region are used, the time elapsing from the photoelectric conversion to detection of the signal carriers in the floating diffusion region FD of the active tap becomes shorter. Further, as the thickness of the substrate 172 becomes smaller, the moving distance of the signal carriers to the floating diffusion region FD of the active tap also becomes shorter.

In view of the above facts, in the back-illuminated ToF sensor, even when the drive frequency is high, the signal carriers (electrons) generated in the respective regions in the substrate 172 can be sufficiently drawn into the floating diffusion region FD of the active tap, and thus, the electron extraction efficiency can be increased. Further, as the thickness of the substrate 172 is reduced, sufficient electron extraction efficiency can be secured even at a high drive frequency, and resistance to high-speed drive can be increased.

Particularly, in the back-illuminated ToF sensor, a sufficient aperture ratio can be obtained. Thus, the pixels can be miniaturized accordingly, and the miniaturization resistance of the pixels can be increased.

Furthermore, as the light receiving element 1 is of a back-illuminated type, freedom is allowed in the back end of line (BEOL) design, and thus, it is possible to increase the degree of freedom in setting a saturation signal amount (Qs).

8. Cross-Sectional View of a Second Example Configuration of Pixels

Figure 12:
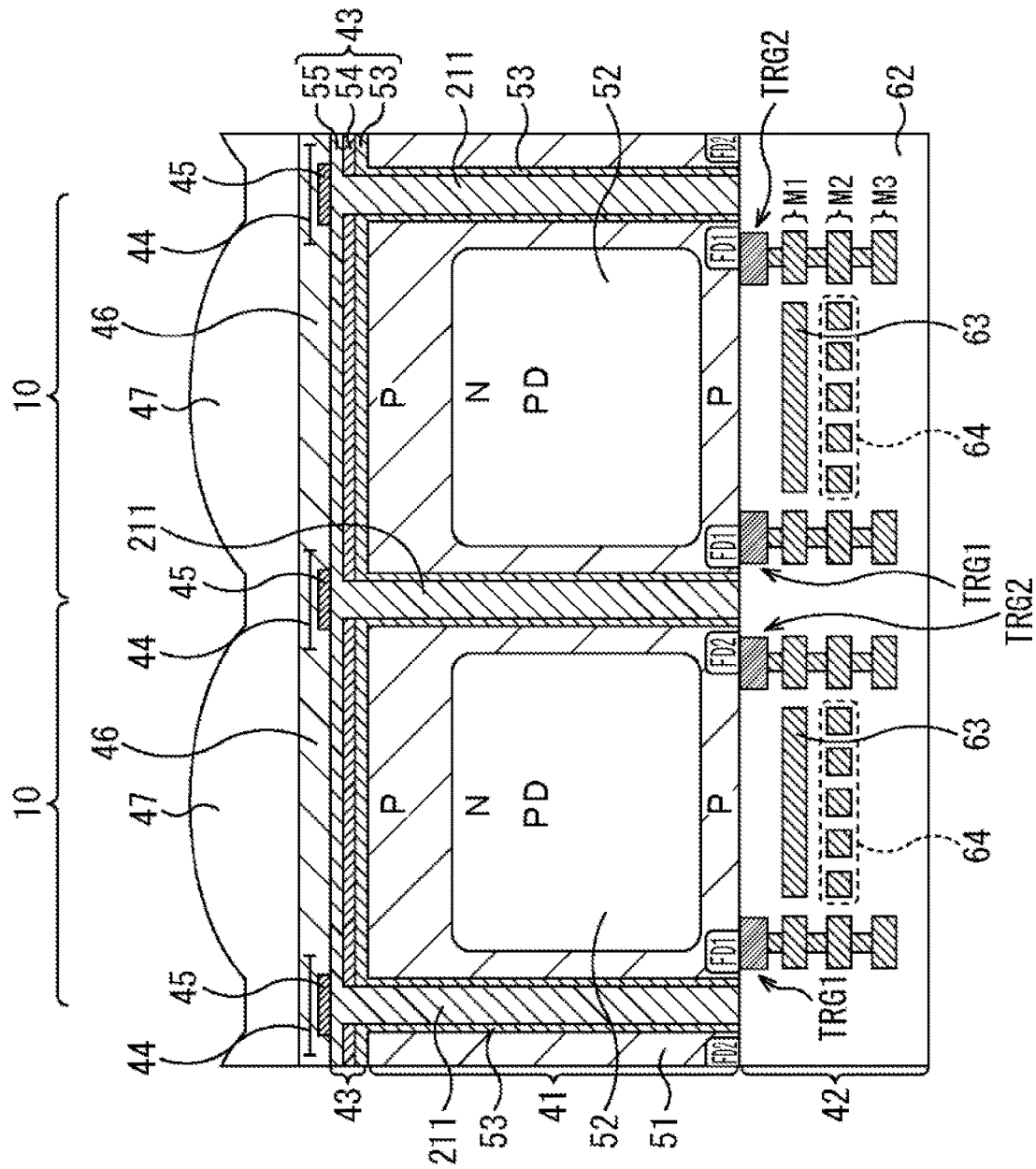
FIG. 12 is a cross-sectional view showing a second example configuration of pixels.

FIG. 12 is a cross-sectional view showing a second example configuration of the pixels 10.

In FIG. 12, the components equivalent to those of the first example configuration shown in FIG. 2 are denoted by the same reference numerals as those used in FIG. 2, and explanation of the components will not be unnecessarily repeated.

The second example configuration in FIG. 12 is the same as the first example configuration in FIG. 2, except that the interpixel separation portions 61 that are deep trench isolation (DTI) formed by digging from the back surface side (the side of the on-chip lenses 47) of the semiconductor substrate 41 are replaced with interpixel separation portions 211 penetrating the semiconductor substrate 41.

The interpixel separation portions 211 are formed in the following manner: trenches are formed from the back surface side (the side of the on-chip lenses 47) or from the front surface side of the semiconductor substrate 41 until reaching the substrate surface on the opposite side, and the trenches are filled with the silicon oxide film 55, which is the material of the uppermost layer of the antireflective film 43. The material to be buried as the interpixel separation portions 211 in the trenches may be a metal material such as tungsten (W), aluminum (Al), titanium (Ti), or titanium nitride (TiN), for example, other than an insulating film such as the silicon oxide film 55.

As such interpixel separation portions 211 are formed, it is possible to completely separate adjacent pixels electrically from each other. As a result, the interpixel separation portions 211 prevent incident light from reaching the neighboring pixels 10, and confine the incident light in the respective pixels. The interpixel separation portions 211 also prevent leakage of incident light from the adjacent pixels 10.

As the second example configuration is also a pixel structure of a back-illuminated type, a sufficient aperture ratio can be secured compared with that in a case with a surface-illuminated structure. Thus, quantum efficiency (QE)×aperture ratio (FF) can be maximized. Further, of the plurality of metal films M in the multilayer wiring layer 42, the first metal film M1 closest to the semiconductor substrate 41 has the light blocking members (the reflective members) 63 in regions located below the formation regions of the photodiodes PD, so that infrared light that has not been photoelectrically converted in the semiconductor substrate 41 and has passed through the semiconductor substrate 41 is reflected by the light blocking members 63 and is made to reenter the semiconductor substrate 41. With this arrangement, the amount of infrared light to be photoelectrically converted in the semiconductor substrate 41 can be further increased, and the quantum efficiency (QE), which is the sensitivity of the pixels 10 to infrared light, can be improved. Further, the infrared light that has not been photoelectrically converted in the semiconductor substrate 41 and has passed through the semiconductor substrate 41 is prevented from being scattered by the metal films M and entering the neighboring pixels. Thus, it is possible to prevent erroneous light detection at the neighboring pixels.

9. Cross-Sectional View of a Third Example Configuration of Pixels

Figure 13:
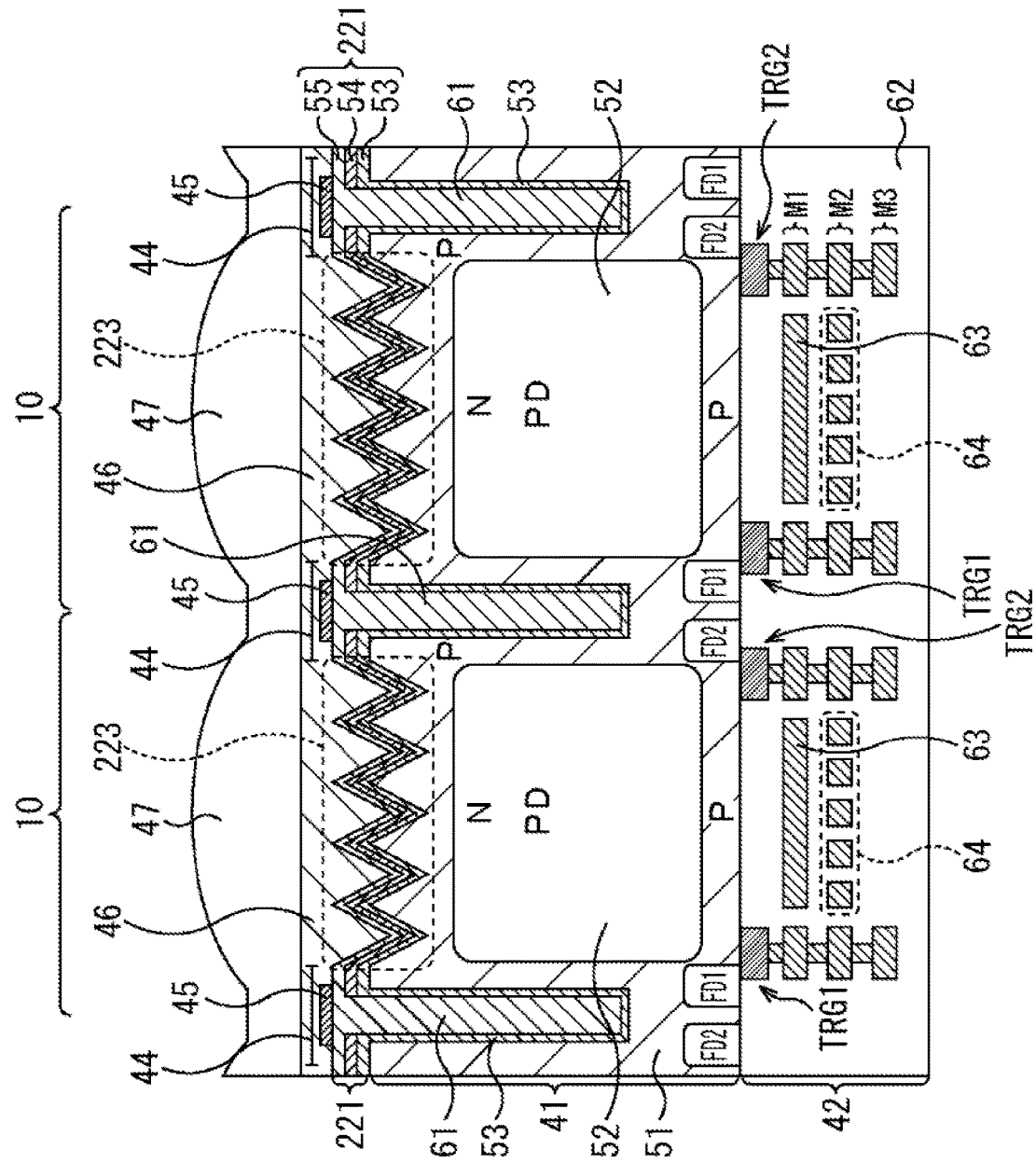
FIG. 13 is a cross-sectional view showing a third example configuration of pixels.

FIG. 13 is a cross-sectional view showing a third example configuration of the pixels 10.

In FIG. 13, the components equivalent to those of the first example configuration shown in FIG. 2 are denoted by the same reference numerals as those used in FIG. 2, and explanation of the components will not be unnecessarily repeated.

In the third example configuration in FIG. 13, PD upper regions 223 located above the formation regions of the photodiodes PD in (the P-type semiconductor region 51 of) the semiconductor substrate 41 each have a moth-eye structure in which minute concavities and convexities are formed. Further, in conformity with the moth-eye structures in the PD upper regions 223 in the semiconductor substrate 41, an antireflective film 221 formed on the upper surfaces thereof also has a moth-eye structure. The antireflective film 221 is formed with a stack of a hafnium oxide film 53, an aluminum oxide film 54, and a silicon oxide film 55, as in the first example configuration.

As the PD upper regions 223 of the semiconductor substrate 41 are moth-eye structures as described above, it is possible to alleviate the abrupt change in the refractive index at the substrate interface, and reduce the influence of reflected light.

Note that, in FIG. 13, the interpixel separation portions 61 formed with DTI formed by digging from the back surface side (the side of the on-chip lenses 47) of the semiconductor substrate 41 are formed to reach slightly deeper positions than the interpixel separation portions 61 of the first example configuration in FIG. 2. The depth in the substrate thickness direction in which the interpixel separation portions 61 are formed may be set at any depth as above.

In the other aspects, the third example configuration is similar to the first example configuration.

10. Cross-Sectional View of a Fourth Example Configuration of Pixels

Figure 14:
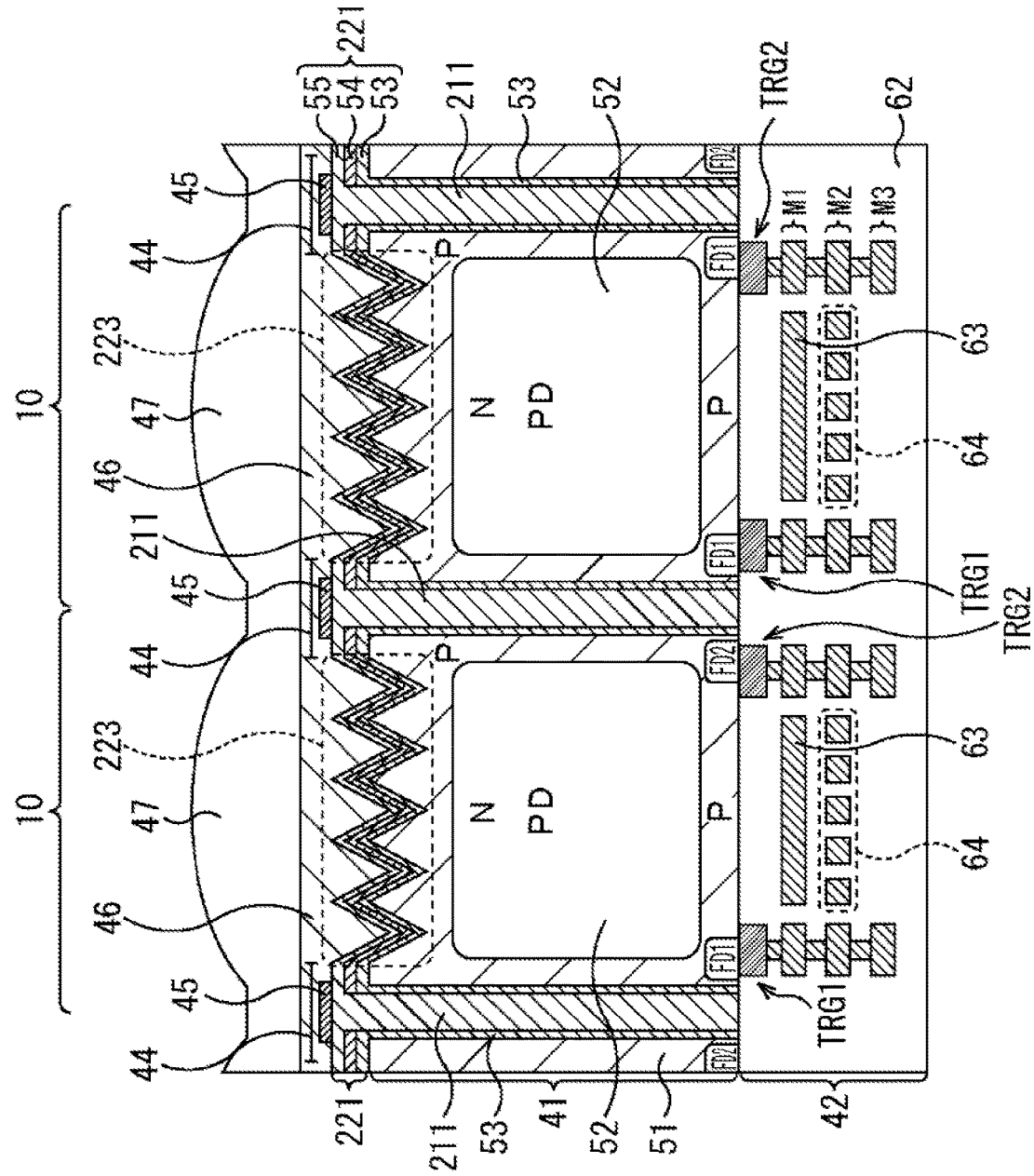
FIG. 14 is a cross-sectional view showing a fourth example configuration of pixels.

FIG. 14 is a cross-sectional view showing a fourth example configuration of the pixels 10.

In FIG. 14, the components equivalent to those of the first through third example configurations described above are denoted by the same reference numerals as those used above, and explanation of the components will not be unnecessarily repeated.

The fourth example configuration in FIG. 14 is the same as the third example configuration shown in FIG. 13 in that the PD upper regions 223 each include a substrate interface having a moth-eye structure and the antireflective film 221.

The fourth example configuration in FIG. 14 is also the same as the second example configuration shown in FIG. 12 in including the interpixel separation portions 211 penetrating the entire semiconductor substrate 41.

In other words, the fourth example configuration in FIG. 14 includes both the interpixel separation portions 211 of the second example configuration, and the semiconductor substrate 41 and the antireflective film 221 having moth-eye structures of the third example configuration. In the other aspects, the fourth example configuration is similar to the second example configuration or the third example configuration.

As the third and fourth example configurations are also pixel structures of a back-illuminated type, a sufficient aperture ratio can be secured compared with that in a case with a surface-illuminated structure. Thus, quantum efficiency (QE)×aperture ratio (FF) can be maximized. Further, the light blocking member (the reflective member) 63 is provided in a predetermined metal film M in the multilayer wiring layer 42, the sensitivity of the pixels 10 to infrared light can be increased, and erroneous light detection at neighboring pixels can be prevented.

11. Cross-Sectional View of a Fifth Example Configuration of Pixels

FIG. 15 is a cross-sectional view showing a fifth example configuration of the pixels 10.

In FIG. 15, the components equivalent to those of the first through fourth example configurations described above are denoted by the same reference numerals as those used above, and explanation of the components will not be unnecessarily repeated.

In the first through fourth example configurations described above, the interpixel separation portions 61 or the interpixel separation portions 211 provided in the pixel boundary portions 44 may be omitted.

For example, if the interpixel separation portions 61 of the third example configuration described above or the interpixel separation portions 211 of the fourth example configuration described above are omitted, the structure shown in FIG. 15 is obtained.

The fifth example configuration in FIG. 15 has the configuration of the third example configuration minus the interpixel separation portions 61 or the configuration of the fourth example configuration minus the interpixel separation portions 211. In the fifth example configuration, the antireflective film 221 is formed as a flat film in each of the pixel boundary portions 44. In the other aspects, the fifth example configuration is similar to the third example configuration or the fourth example configuration.

<Perspective Views of Moth-Eye Structures>

Figure 16A:
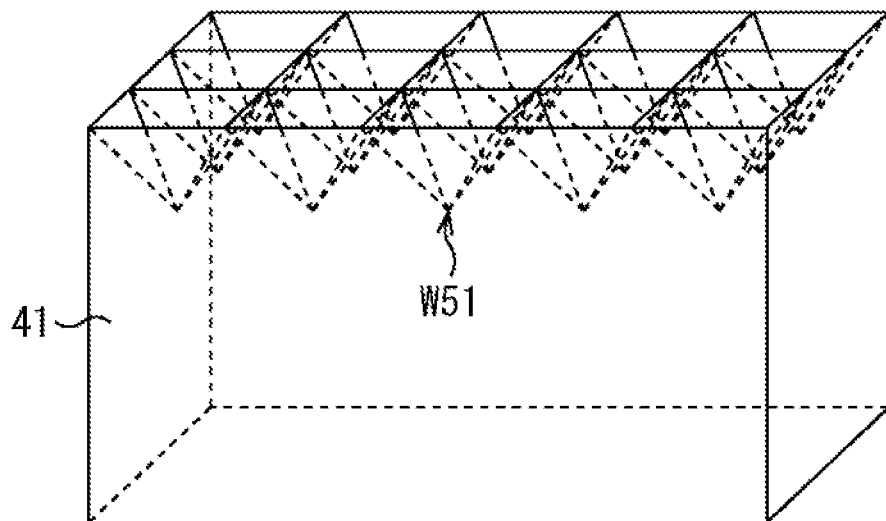
FIGS. 16A and 16B are perspective views showing an example configuration of a moth-eye structure.

FIG. 16A is a perspective view of a moth-eye structure formed in a PD upper region 223 of the semiconductor substrate 41.

In the moth-eye structure in the semiconductor substrate 41, a plurality of quadrangular pyramidal regions of substantially the same shape having its apex on the side of the semiconductor substrate 41 and of substantially the same size is regularly arranged (in a grid-like pattern), as shown in FIG. 16A, for example.

Note that, in FIG. 16A, the upper side of the semiconductor substrate 41 is the light incident side, which is the side of the on-chip lens 47.

The moth-eye structure is formed on the light incident surface side of the semiconductor substrate 41, and has an inverse pyramid structure in which a plurality of quadrangular pyramidal regions having their apexes on the side of the photodiode PD is regularly arranged. The bottom surface of each quadrangular pyramid has a square shape, and the semiconductor substrate 41 is dug so that each quadrangular pyramidal region is convex on the side of the photodiode PD. In FIG. 16A, a portion indicated by an arrow W51 is the concave portion of the apex portion of each quadrangular pyramidal region on the side of the photodiode PD, for example. The concave portion indicated by the arrow W51 has a curvature, and has a roundish shape, for example.

Figure 16B:
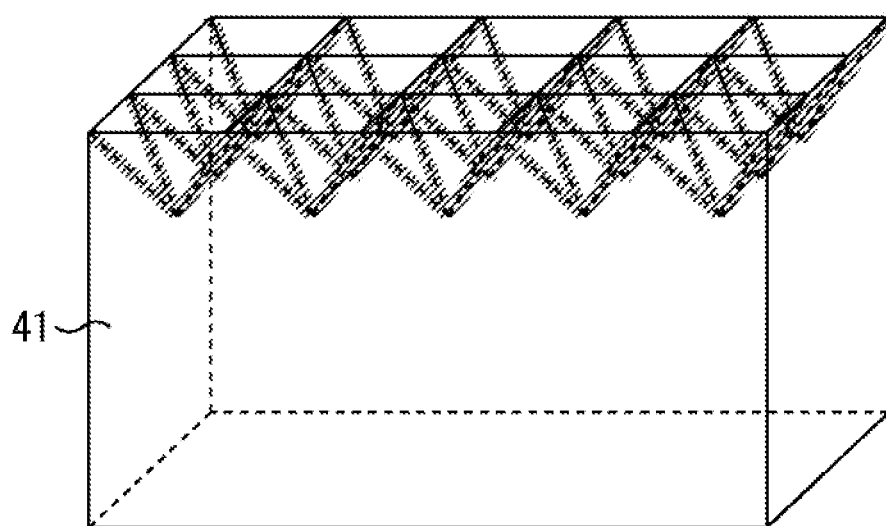

Note that not only the respective concave portions of the respective quadrangular pyramids in the moth-eye structure but also the oblique portions of the respective quadrangular pyramidal regions, which are shaded portions in FIG. 16B, may also have a certain curvature. As the oblique portions also have a curvature, it is possible to further improve the effect to reduce formation unevenness and peeling of the planarization film 46.

Figure 17A:
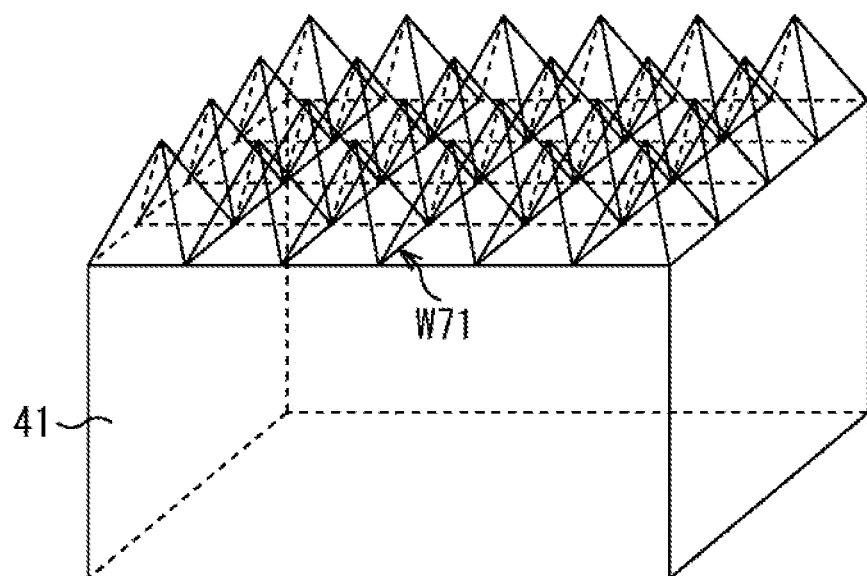
FIGS. 17A and 17B are perspective views showing another example configuration of a moth-eye structure.
Figure 17B:
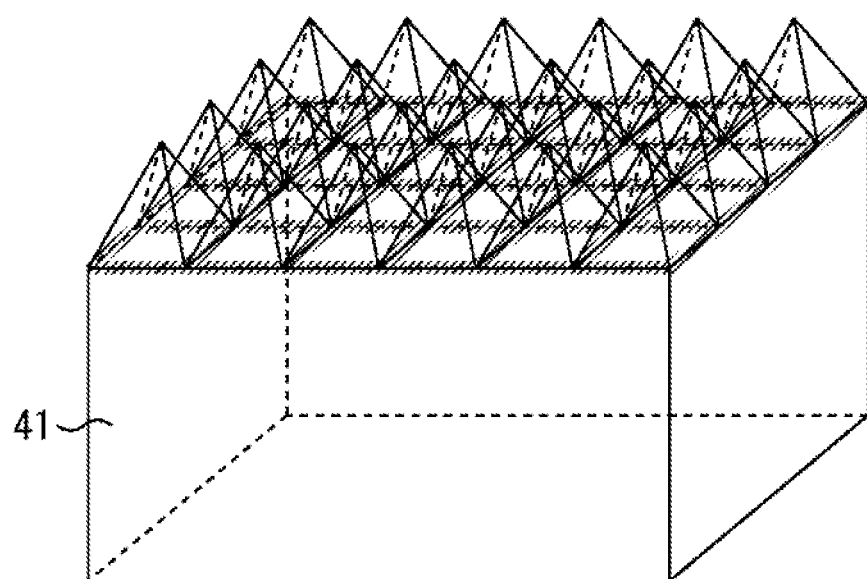

FIGS. 17A and 17B are perspective views showing another example of a moth-eye structure in the semiconductor substrate 41.

In the example described above with reference to FIGS. 16A and 16B, the moth-eye structure is an inverse pyramid structure formed with quadrangular pyramidal regions having apexes on the side of the photodiode PD. However, the moth-eye structure may be a forward pyramid structure as shown in FIGS. 17A and 17B, for example.

Specifically, as shown in FIG. 17A, the moth-eye structure is formed on the surface of the semiconductor substrate 41 on the light incident side. Further, the moth-eye structure is a forward pyramid structure in which a plurality of quadrangular pyramidal regions having apexes on the side of the on-chip lens 47, which is the light incident side, is regularly arranged in a grid-like pattern.

In FIG. 17A, the plurality of quadrangular pyramidal regions also has substantially the same shape and substantially the same size, and the bottom surface of each quadrangular pyramid has a square shape.

Furthermore, the semiconductor substrate 41 is dug to form the quadrangular pyramidal regions, so that the respective quadrangular pyramidal regions are convex on the opposite side from the side of the photodiode PD.

For example, a portion indicated by an arrow W71 is the concave portion of the base portion of each quadrangular pyramidal region on the side of the photodiode PD. The concave portion indicated by the arrow W71 has a portion that is convex on the side of the photodiode PD when viewed in a cross-section substantially parallel to the direction from the light incident side of the semiconductor substrate 41 toward the photodiode PD. The convex portion has a curvature, and has a roundish shape, as in the example shown in FIGS. 16A and 16B.

In FIG. 17B, the shaded portions formed with the bases of the respective quadrangular pyramids having apexes on the upper side may be formed to have a curvature. In this case, it is possible to reduce formation unevenness and peeling of the planarization film 46 formed on the semiconductor substrate 41, as in the example shown in FIGS. 16A and 16B.

Figure 18A:
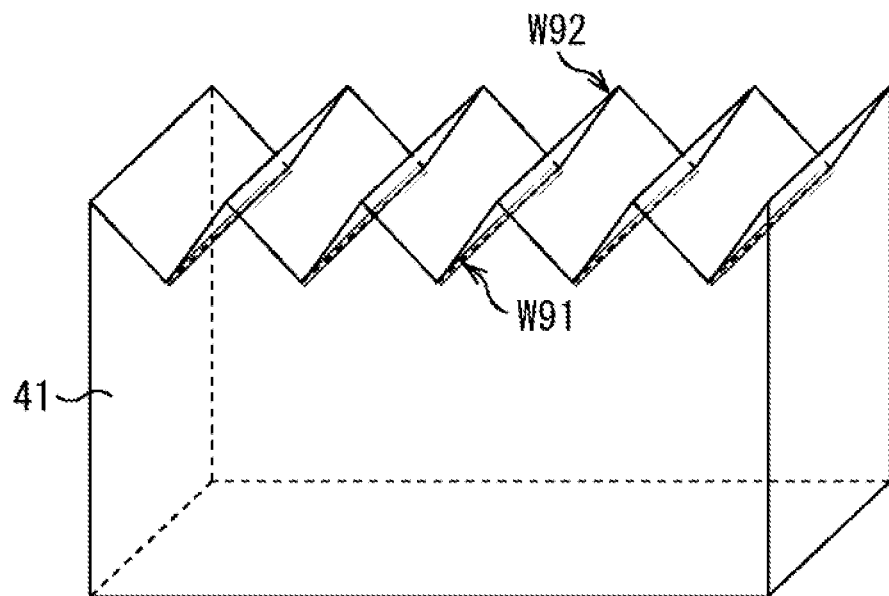
FIGS. 18A and 18B are perspective views showing other example configurations of a moth-eye structure.
Figure 18B:
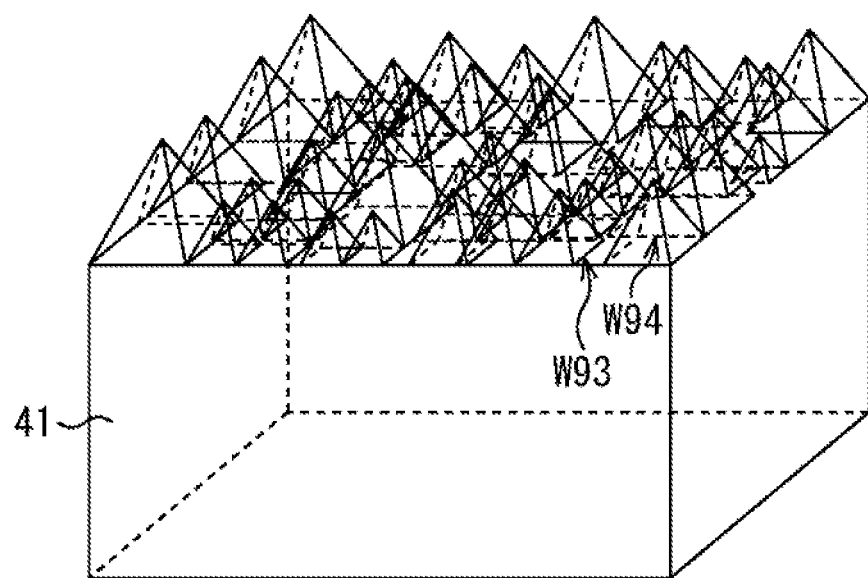

FIGS. 18A and 18B are perspective views showing other examples of a moth-eye structure in the semiconductor substrate 41.

In the moth-eye structure, the bottom surfaces of the minute concavities and convexities may have a rectangular shape, as shown in FIG. 18A, for example.

The moth-eye structure shown in FIG. 18A is formed on the light incident surface side of the semiconductor substrate 41, and has long linear concave portions in the longitudinal direction (vertical direction) or the lateral direction (horizontal direction) of the pixel 10.

More specifically, the moth-eye structure shown in FIG. 18A has a saw-tooth shape when viewed in a cross-section in the same direction as the cross-sectional views in FIGS. 13 through 15, and has a shape in which a plurality of triangular prisms of substantially the same shape and substantially the same size is arranged in one direction while one vertex of each triangle and one rectangular surface of each triangular prism face the photodiode PD.

In FIG. 18A, a portion indicated by an arrow W91 is a concave portion, for example, and a portion indicated by an arrow W92 is a convex portion, for example. The shaded portion of each concave portion has a roundish shape with a predetermined curvature. Accordingly, it is also possible to reduce formation unevenness and peeling of the planarization film 46 formed on the semiconductor substrate 41 in this example.

Further, other than a structure in which quadrangular pyramidal shapes of substantially the same size are regularly arranged, the moth-eye structure in the semiconductor substrate 41 may be a structure in which quadrangular pyramidal shapes of different sizes from one another may be irregularly arranged as shown in FIG. 18B. The example shown in FIG. 18B is a forward pyramid structure in which quadrangular pyramidal regions having apexes on the side of the on-chip lens 47 are irregularly arranged. Furthermore, the sizes of the plurality of quadrangular pyramidal regions are not the same size. In other words, the sizes and the arrangement of the quadrangular pyramids are random.

For example, portions indicated by an arrow W93 and an arrow W94 are concave portions, and the concave portions have a curvature and have roundish shapes. With this arrangement, it is possible to reduce formation unevenness and peeling of the planarization film 46 formed on the semiconductor substrate 41.

FIG. 18B shows a moth-eye structure having a forward pyramid structure in which a plurality of quadrangular pyramidal regions having apexes on the side of the on-chip lens 47 is randomly arranged. However, the inverse pyramid structure shown in FIGS. 16A and 16B may of course be a structure in which the sizes and the arrangement of the plurality of quadrangular pyramidal regions are random.

The moth-eye structure of the semiconductor substrate 41 formed in the PD upper regions 223 can be formed to have the shape shown in any of FIGS. 16A through 18B, for example. With this, it is possible to alleviate the sudden change in the refractive index at the substrate interface, and reduce the influence of reflected light.

Note that, in the third through fifth example configurations in which a moth-eye structure is adopted, in a case where the antireflection effect of the moth-eye structure is sufficient, the antireflective film 221 thereon may be omitted.

12. Cross-Sectional View of a Sixth Example Configuration of Pixels

Figure 19:
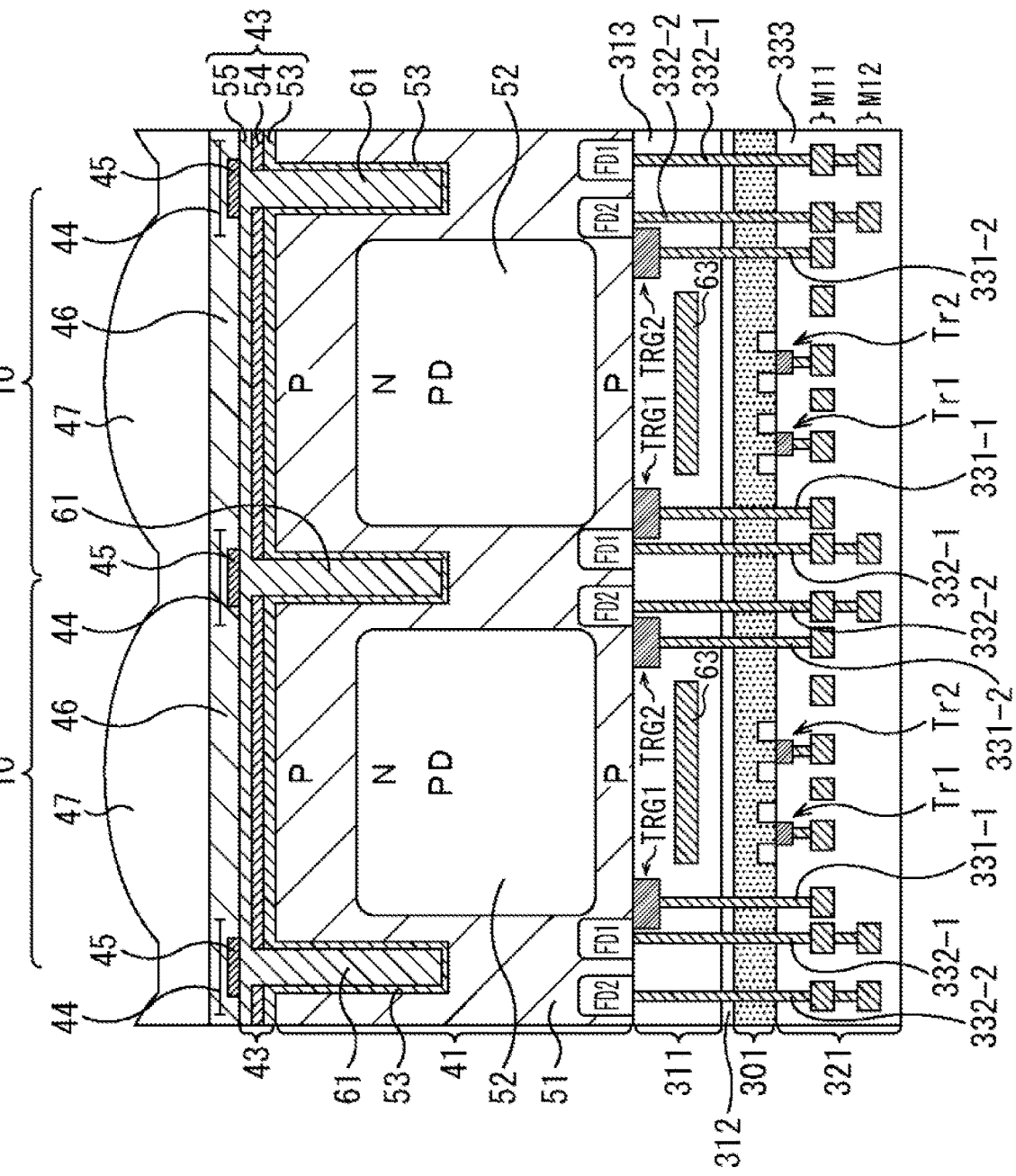
FIG. 19 is a cross-sectional view showing a sixth example configuration of pixels.

FIG. 19 is a cross-sectional view showing a sixth example configuration of the pixels 10.

In FIG. 19, the components equivalent to those of the first through fifth example configurations described above are denoted by the same reference numerals as those used above, and explanation of the components will not be unnecessarily repeated.

In the first through fifth example configurations described above, the light receiving element 1 is formed with a single semiconductor substrate, or only with the semiconductor substrate 41. In the sixth example configuration in FIG. 19, however, the light receiving element 1 is formed with two semiconductor substrates: the semiconductor substrate 41 and a semiconductor substrate 301. In the description below, for easy understanding, the semiconductor substrate 41 and the semiconductor substrate 301 will be also referred to as the first substrate 41 and the second substrate 301, respectively.

The sixth example configuration in FIG. 19 is similar to the first example configuration in FIG. 2 in that the interpixel light blocking films 45, the planarization film 46, and the on-chip lenses 47 are formed on the light incident surface side of the first substrate 41. The sixth example configuration is also similar to the first example configuration in FIG. 2 in that the interpixel separation portions 61 are formed in the pixel boundary portions 44 on the back surface side of the first substrate 41.

The sixth example configuration is also similar to the first example configuration in that the photodiodes PD as the photoelectric conversion portions are formed in the first substrate 41 for the respective pixels, and in that the two transfer transistors TRG1 and TRG2, and the floating diffusion regions FD1 and FD2 as the charge storage portions are formed on the front surface side of the first substrate 41.

On the other hand, a different aspect from the first example configuration in FIG. 2 is that an insulating layer 313 of a wiring layer 311 on the front surface side of the first substrate 41 is bonded to an insulating layer 312 of the second substrate 301.

The wiring layer 311 of the first substrate 41 includes at least one metal film M, and the light blocking members 63 are formed with the metal film M in regions located below the formation regions of the photodiodes PD.

Pixel transistors Tr1 and Tr2 are formed at the interface on the opposite side from the side of the insulating layer 312, which is the bonding surface side of the second substrate 301. The pixel transistors Tr1 and Tr2 are amplification transistors AMP and selection transistors SEL, for example.

In other words, in the first through fifth example configurations only including the single semiconductor substrate 41 (the first substrate 41), all of the pixel transistors including the transfer transistors TRG, the switch transistors FDG, the amplification transistors AMP, and the selection transistors SEL are formed in the semiconductor substrate 41. In the light receiving element 1 of the sixth example configuration including a stack structure of two semiconductor substrates, on the other hand, the pixel transistors other than the transfer transistors TRG, or the switch transistors FDG, the amplification transistors AMP, and the selection transistors SEL are formed in the second substrate 301.

A multilayer wiring layer 321 including at least two metal films M is formed on the opposite side of the second substrate 301 from the side of the first substrate 41. The multilayer wiring layer 321 includes a first metal film M11, a second metal film M12, and an interlayer insulating film 333.

The transfer drive signal TRG1g for controlling the transfer transistors TRG1 is supplied from the first metal film M11 of the second substrate 301 to the gate electrodes of the transfer transistors TRG1 of the first substrate 41 by through silicon vias (TSVs) 331-1 penetrating the second substrate 301. The transfer drive signal TRG2g for controlling the transfer transistors TRG2 is supplied from the first metal film M11 of the second substrate 301 to the gate electrodes of the transfer transistors TRG2 of the first substrate 41 by TSVs 331-2 penetrating the second substrate 301.

Likewise, the charges accumulated in the floating diffusion regions FD1 are transferred from the side of the first substrate 41 to the first metal film M11 of the second substrate 301 by TSVs 332-1 penetrating the second substrate 301. The charges accumulated in the floating diffusion regions FD2 are transferred from the side of the first substrate 41 to the first metal film M11 of the second substrate 301 by TSVs 332-2 penetrating the second substrate 301.

The wiring capacitors 64 are formed in a region (not shown) of the first metal film M11 or the second metal film M12. The metal film M in which the wiring capacitors 64 are formed is designed to have a high wiring density for capacitor formation, and the metal film M connected to the gate electrodes of the transfer transistors TRG, the switch transistors FDG, or the like is designed to have a low wiring density to reduce induced current. The wiring layer (metal film M) to be connected to the gate electrodes may vary with each pixel transistor.

As described above, the pixels 10 of the sixth example configuration can be formed by stacking two semiconductor substrates: the first substrate 41 and the second substrate 301. The pixel transistors other than the transfer transistors TRG are formed in the second substrate 301, which is different from the first substrate 41 including the photoelectric conversion portions. Further, the vertical drive unit 22 that controls driving of the pixels 10, the pixel drive lines 28, the vertical signal lines 29 that transmit detection signals, and the like are also formed in the second substrate 301. Thus, the pixels can be miniaturized, and the degree of freedom in the back end of line (BEOL) design becomes higher.

As the sixth example configuration is also a pixel structure of a back-illuminated type, a sufficient aperture ratio can be secured compared with that in a case with a surface-illuminated structure. Thus, quantum efficiency (QE)×aperture ratio (FF) can be maximized. Further, the regions of the wiring layer 311 that is the closest to the first substrate 41 and overlaps the formation regions of the photodiodes PD include the light blocking members (the reflective members) 63, so that infrared light that has not been photoelectrically converted in the semiconductor substrate 41 and has passed through the semiconductor substrate 41 is reflected by the light blocking members 63 and is made to reenter the semiconductor substrate 41. With this arrangement, the amount of infrared light to be photoelectrically converted in the semiconductor substrate 41 can be further increased, and the quantum efficiency (QE), which is the sensitivity of the pixels 10 to infrared light, can be improved. Further, the infrared light that has not been photoelectrically converted in the semiconductor substrate 41 and has passed through the semiconductor substrate 41 can be prevented from entering the side of the second substrate 301.

Manufacturing Method in the Sixth Example Configuration

Referring now to FIGS. 20A through 20F, a manufacturing method in the sixth example configuration is described.

Figure 20A:
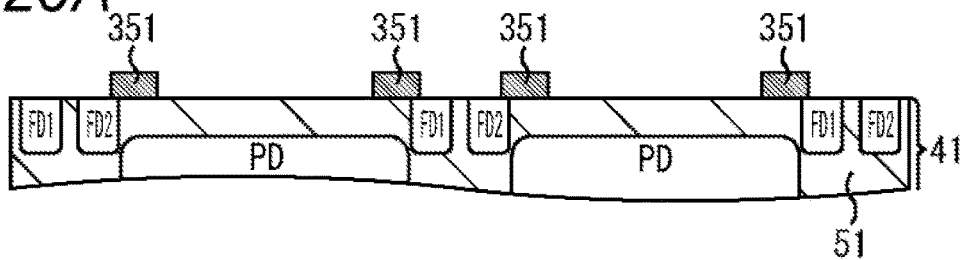
FIGS. 20A through 20F are diagrams for explaining a manufacturing method in the sixth example configuration.

First, as shown in FIG. 20A, after the photodiodes PD as the photoelectric conversion portions and the floating diffusion regions FD are formed pixel by pixel in predetermined regions in the first substrate 41, the gate electrodes 351 of the transfer transistors TRG are formed.

Figure 20B:
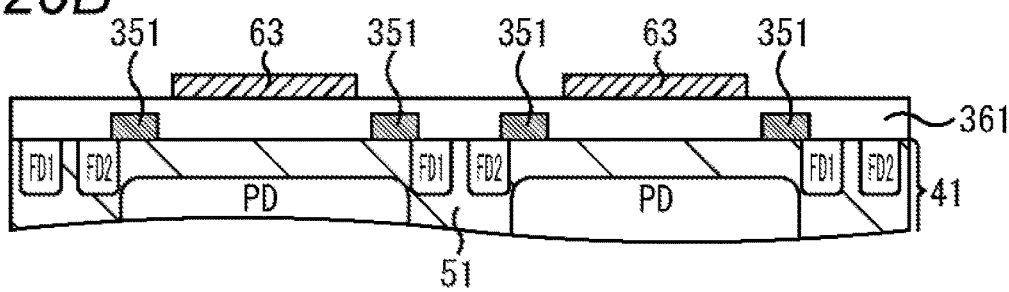

Next, as shown in FIG. 20B, after an insulating film 361 is formed on the gate electrodes 351 of the transfer transistors TRG and the upper surface of the first substrate 41, the light blocking members 63 corresponding to the regions of the photodiodes PD are formed as a pattern.

Figure 20C:
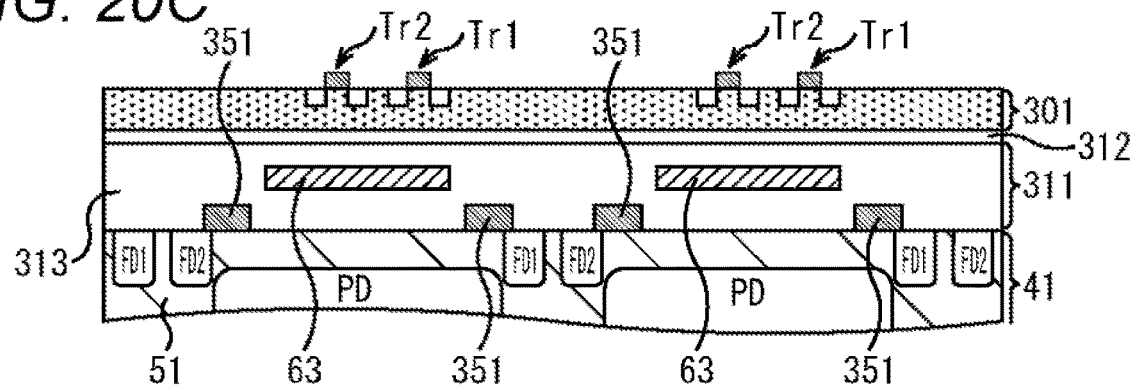

Next, as shown in FIG. 20C, an insulating film is further stacked on the light blocking members 63 and the insulating film 361, to form the insulating layer 313, and the wiring layer 311 that is the front surface side of the first substrate 41 is formed. Then, the insulating layer 312 on the back surface side of the second substrate 301 in which the pixel transistors Tr1 and Tr2 such as the amplification transistors AMP and the selection transistors SEL are formed in advance is bonded to the insulating layer 313 of the first substrate 41.

Figure 20D:
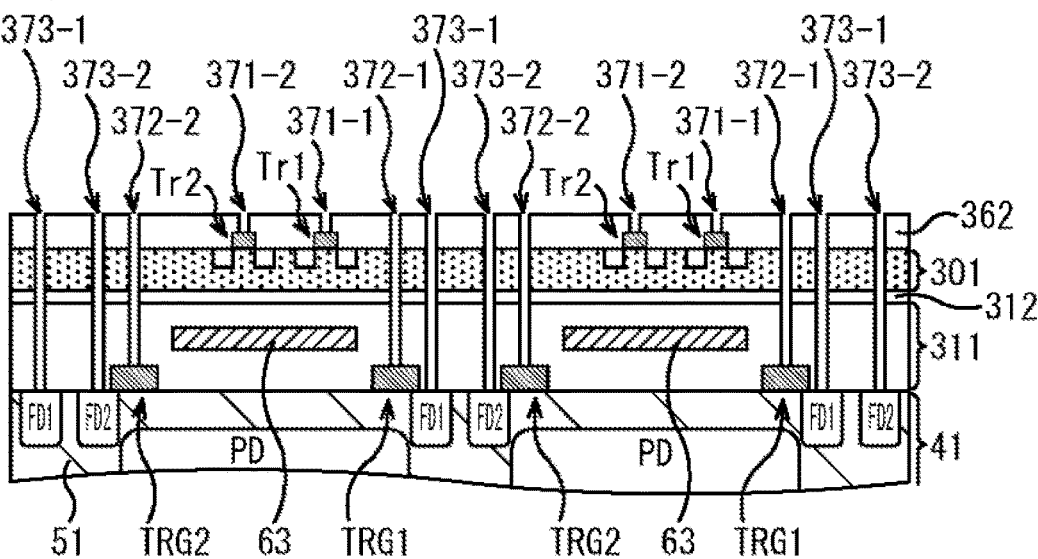

Next, as shown in FIG. 20D, after an insulating layer 362 is formed on the upper surface of the second substrate 301, trenches 371-1 and 371-2 for contact with the gate electrodes of the pixel transistors Tr1 and Tr2 are formed. Further, trenches 372-1, 372-2, 373-1, and 373-2 penetrating the second substrate 301 are formed at the portions necessary for electrically connecting the first substrate 41 and the second substrate 301, such as the gate electrodes of the transfer transistors TRG1 and TRG2, and the floating diffusion regions FD1 and FD2.

Figure 20E:
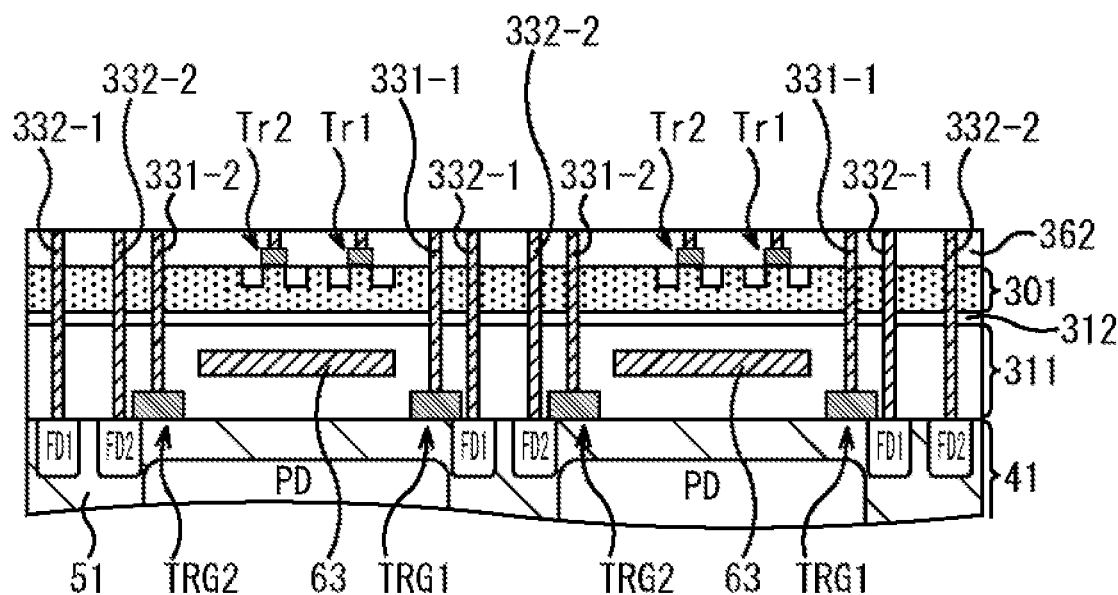

Next, as shown in FIG. 20E, the trenches 371-1 and 371-2, and the trenches 372-1, 372-2, 373-1, and 373-2 are filled with a metal material such as tungsten (W). As a result, the TSVs 331-1, 331-2, 332-1, and 332-2 are formed.

Figure 20F:
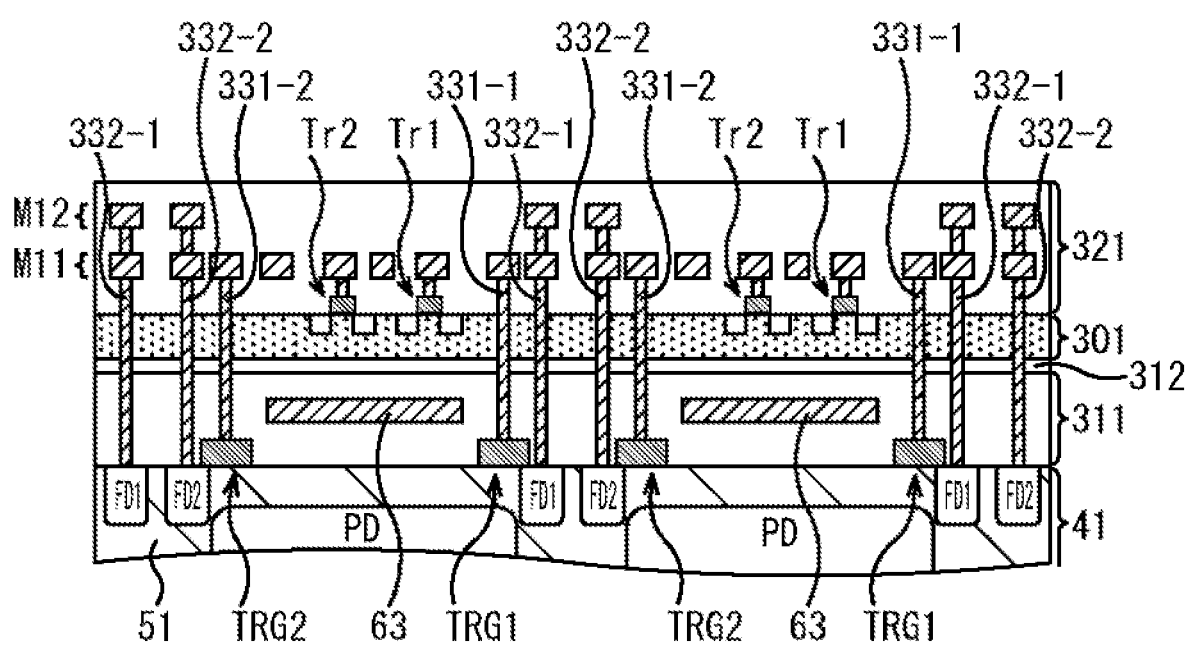

Next, as shown in FIG. 20F, the first metal film M11, the second metal film M12, and an insulating layer are formed on the insulating layer 362, and thus, the multilayer wiring layer 321 is formed.

After FIG. 20F, the antireflective film 43, the on-chip lenses 47, and the like are formed on the back surface side that is the light incident surface of the first substrate 41. Thus, the light receiving element 1 in FIG. 19 is completed.

Note that the sixth example configuration shown in FIG. 19 is a configuration formed by modifying the first example configuration shown in FIG. 2 into a stack structure of two semiconductor substrates. However, it is of course possible to adopt a configuration formed by modifying any of the second through fifth example configurations into a stack structure of two semiconductor substrates.

13. Example of a Four-Tap Pixel Configuration

Each pixel 10 in the first through sixth example configurations is a so-called two-tap pixel structure that has two transfer transistors TRG1 and TRG2 as the transfer gates for one photodiode PD, has two floating diffusion regions FD1 and FD2 as charge storage portions, and distributes charges generated in the photodiode PD to the two floating diffusion regions FD1 and FD2.

On the other hand, a pixel 10 may be a so-called four-tap pixel structure that has four transfer transistors TRG1 through TRG4 and floating diffusion regions FD1 through FD4 for one photodiode PD, and distributes charges generated in the photodiode PD to the four floating diffusion regions FD1 through FD4.

Figure 21:
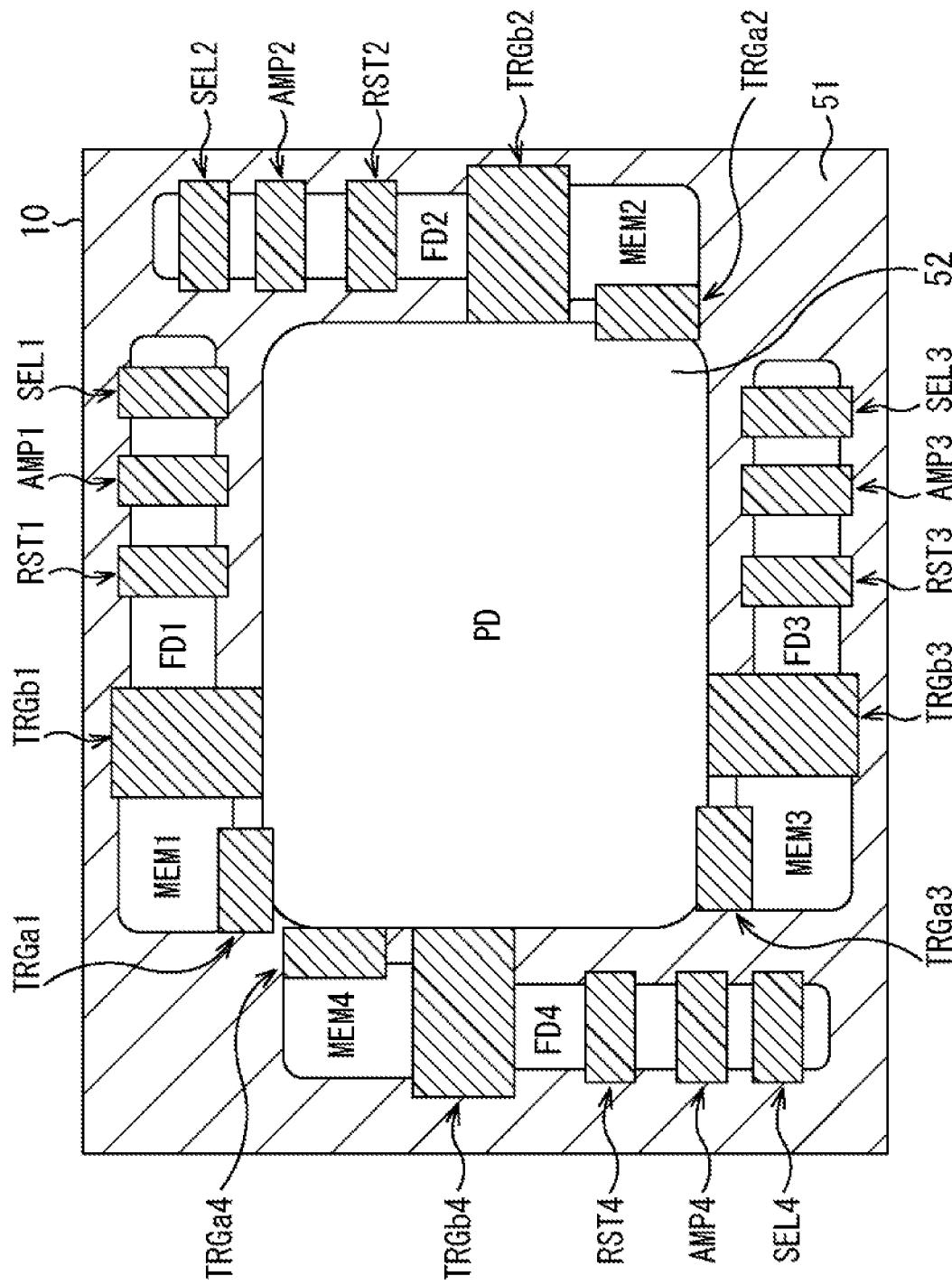
FIG. 21 is a diagram showing an example of a four-tap pixel configuration.

FIG. 21 is a plan view of a pixel 10 in a case of a four-tap pixel structure.

The pixel 10 includes four sets of a first transfer transistor TRGa, a second transfer transistor TRGb, a reset transistor RST, an amplification transistor AMP, and a selection transistor SEL.

Outside the photodiode PD, one set of a first transfer transistor TRGa, a second transfer transistor TRGb, a reset transistor RST, an amplification transistor AMP, and a selection transistor SEL is linearly arranged along each one side of the four sides of the rectangular pixel 10.

In FIG. 21, each set of a first transfer transistor TRGa, a second transfer transistor TRGb, a reset transistor RST, an amplification transistor AMP, and a selection transistor SEL, which are arranged along one of the four sides of the rectangular pixel 10, are denoted with one of the numbers 1 through 4, and thus, is distinguished from the other sets.

As described above, a pixel 10 may have a structure that distributes charges generated in the photodiode PD to two taps, or a structure that distributes the charges to four taps. A pixel 10 does not necessarily have a two-tap structure, and may have a structure with three or more taps.

For example, in a case where a pixel 10 has a two-tap structure, driving is performed to distribute generated charges to the two floating diffusion regions FD by shifting the phase (the light reception timing) by 180 degrees between the first tap and the second tap. In a case where a pixel 10 has a four-tap structure, on the other hand, driving may be performed to distribute generated charges to four floating diffusion regions FD by shifting the phase (the light reception timing) by 90 degrees between each two taps among the first through fourth taps. The distance to the object can be then determined, on the basis of the distribution ratio of the charges accumulated in the four floating diffusion regions FD.

14. Example Configuration of a Ranging Module

Figure 22:
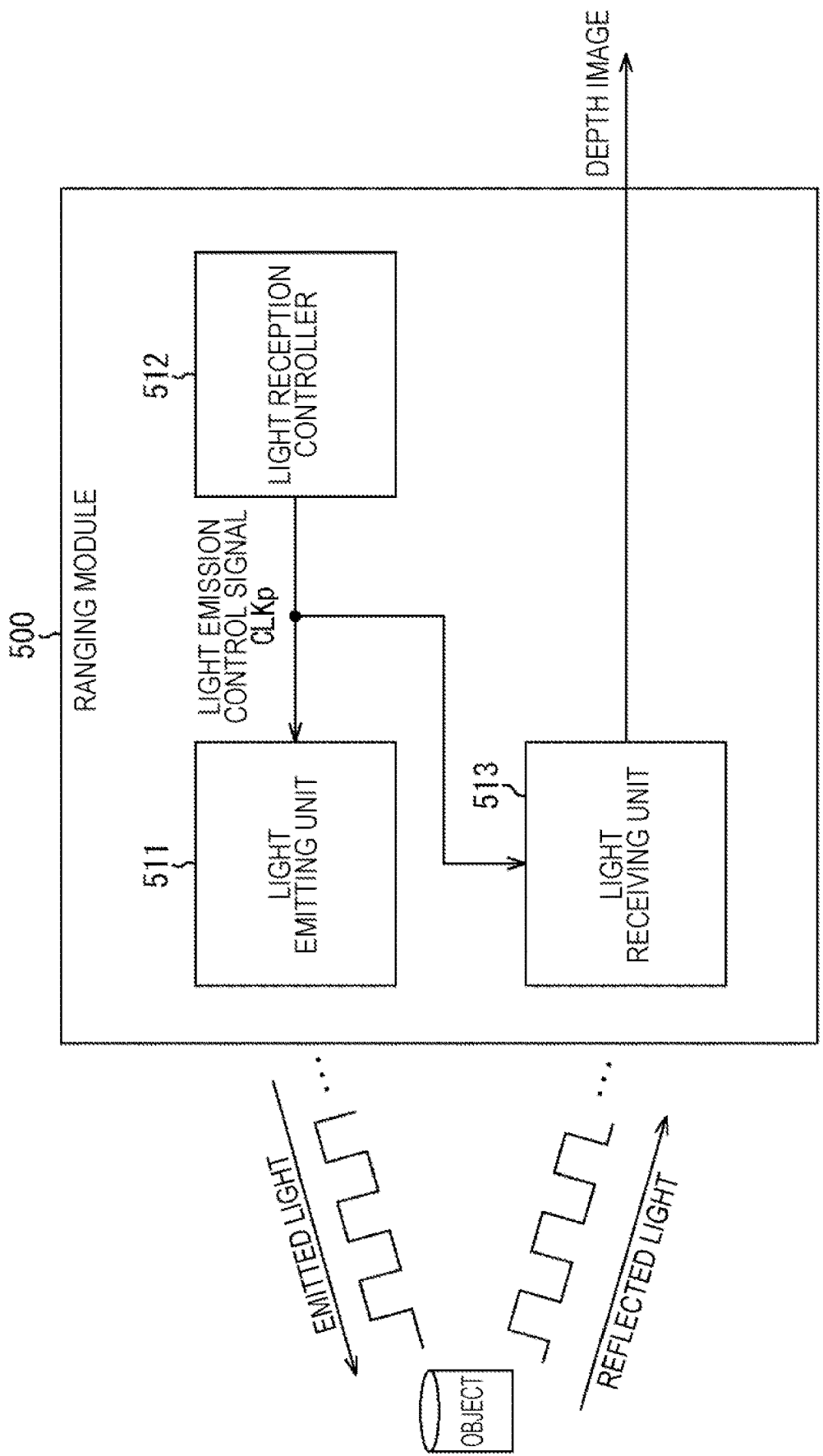
FIG. 22 is a block diagram showing an example configuration of a ranging module to which an embodiment of the present technology is applied.

FIG. 22 is a block diagram showing an example configuration of a ranging module that outputs ranging information, using the light receiving element 1 described above.

A ranging module 500 includes a light emitting unit 511, a light emission controller 512, and a light receiving unit 513.

The light emitting unit 511 has a light source that emits light of a predetermined wavelength, and emits irradiation light whose brightness periodically changes, to an object. For example, the light emitting unit 511 has a light emitting diode that emits infrared light having a wavelength of 780 nm to 1000 nm as the light source, and emits irradiation light in synchronization with a square-wave light emission control signal CLKp supplied from the light emission controller 512.

Note that the light emission control signal CLKp is not necessarily of a square wave, but has to be a periodic signal. For example, the light emission control signal CLKp may be a sine wave.

The light emission controller 512 supplies the light emission control signal CLKp to the light emitting unit 511 and the light receiving unit 513, and controls the timing to emit irradiation light. The frequency of the light emission control signal CLKp is 20 megahertz (MHz), for example. Note that the frequency of the light emission control signal CLKp is not necessarily 20 megahertz (MHz), and may be 5 megahertz (MHz) or the like.

The light receiving unit 513 receives light reflected from the object, calculates distance information for each pixel in accordance with the light reception result, and generates and outputs a depth image in which the depth value corresponding to the distance to the object (subject) is stored as a pixel value.

A light receiving element 1 having the pixel structure of any of the above described first through sixth example configuration is used as the light receiving unit 513. For example, the light receiving element 1 as the light receiving unit 513 calculates distance information for each pixel, from the signal intensity corresponding to the charges that have been distributed to the floating diffusion region FD1 or FD2 of each pixel 10 in the pixel array unit 21 on the basis of the light emission control signal CLKp. Note that the number of taps of each pixel 10 may be four or the like as described above.

As described above, a light receiving element 1 having the pixel structure of any of the first through sixth example configurations described above can be incorporated as the light receiving unit 513 into the ranging module 500 that calculates and outputs information indicating the distance to the object by an indirect ToF method. Thus, the ranging characteristics of the ranging module 500 can be improved.

15. Example Configuration of an Electronic Apparatus

Note that a light receiving element 1 can be applied to a ranging module as described above, and can also be applied to various electronic apparatuses such as an imaging device like a digital still camera or a digital video camera having a ranging function, and a smartphone having a ranging function, for example.

Figure 23:
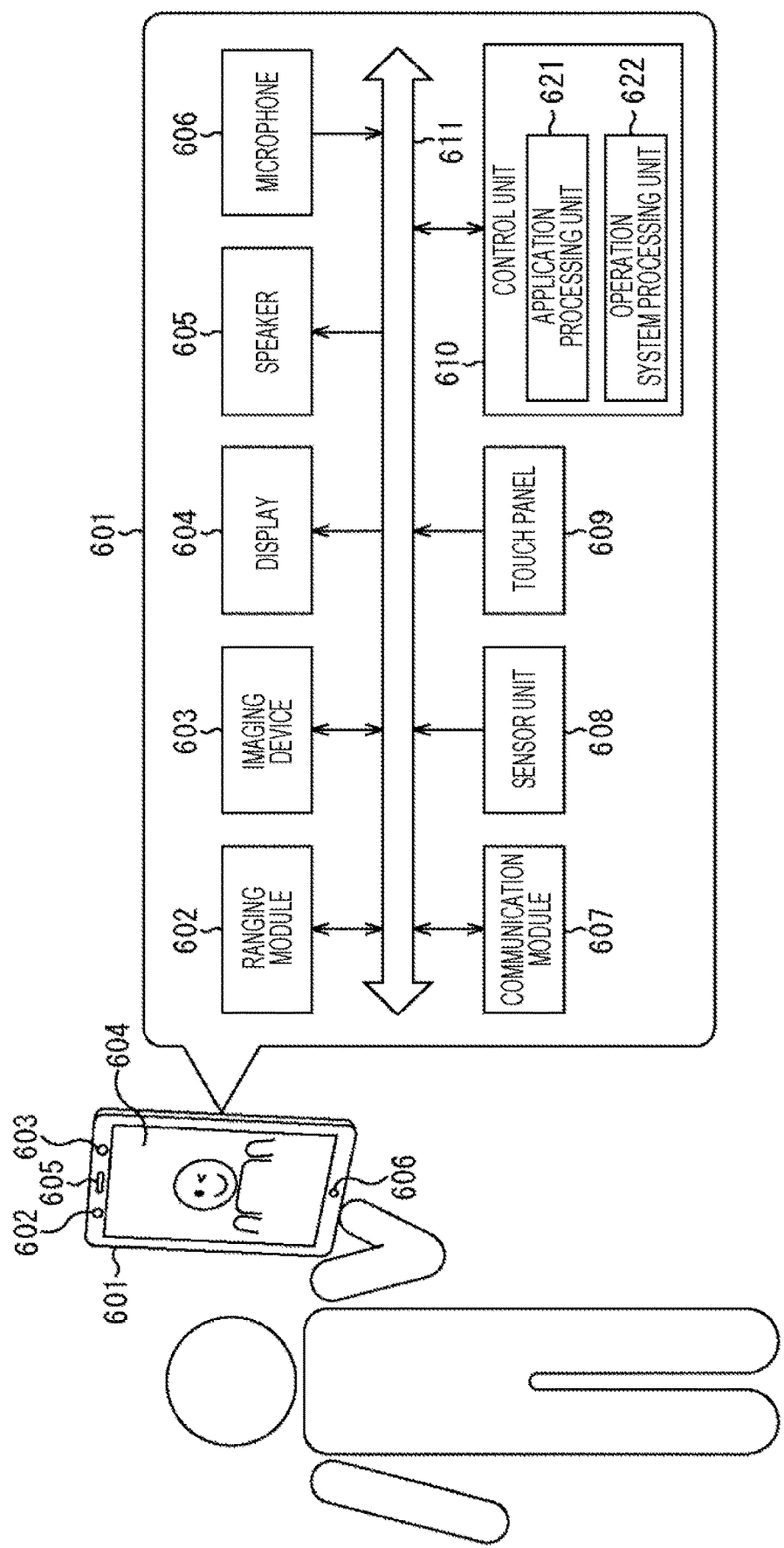
FIG. 23 is a block diagram showing an example configuration of a smartphone as an electronic apparatus to which an embodiment of the present technology is applied.

FIG. 23 is a block diagram showing an example configuration of a smartphone as an electronic apparatus to which the present technology is applied.

As shown in FIG. 23, a smartphone 601 includes a ranging module 602, an imaging device 603, a display 604, a speaker 605, a microphone 606, a communication module 607, a sensor unit 608, a touch panel 609, and a control unit 610, which are connected via a bus 611. Further, in the control unit 610, a CPU executes a program, to achieve functions as an application processing unit 621 and an operation system processing unit 622.

The ranging module 500 IN FIG. 22 is applied to the ranging module 602. For example, the ranging module 602 is disposed in the front surface of the smartphone 601, and performs ranging for the user of the smartphone 601, to output the depth value of the surface shape of the user's face, hand, finger, or the like as a measurement result.

The imaging device 603 is disposed in the front surface of the smartphone 601, and acquires an image showing the user by performing imaging of the user of the smartphone 601 as the subject. Note that, although not illustrated, the imaging device 603 may also be disposed in the back surface of the smartphone 601.

The display 604 displays an operation screen for performing processing with the application processing unit 621 and the operation system processing unit 622, an image captured by the imaging device 603, or the like.

The speaker 605 and the microphone 606 output the voice from the other end, and collect the voice of the user, when a voice call is made with the smartphone 601, for example.

The communication module 607 performs network communication via a communication network such as the Internet, a public telephone network, a wide area communication network for wireless mobile objects, such as a so-called 4G network or a 5G network, a wide area network (WAN), or a local area network (LAN), short-range wireless communication such as Bluetooth (registered trademark) or near field communication (NFC), or the like. The sensor unit 608 senses velocity, acceleration, proximity, and the like, and the touch panel 609 acquires a touch operation performed by the user on an operation screen displayed on the display 604.

The application processing unit 621 performs processing for providing various services through the smartphone 601. For example, the application processing unit 621 can perform a process of creating a face by computer graphics that virtually reproduces the user's expression and displaying the face on the display 604, on the basis of the depth value supplied from the ranging module 602.

The application processing unit 621 can also perform a process of creating three-dimensional shape data of a three-dimensional object, for example, on the basis of the depth value supplied from the ranging module 602. The operation system processing unit 622 performs a process to achieve the basic functions and operations of the smartphone 601. For example, the operation system processing unit 622 can perform a process of authenticating the user's face on the basis of the depth value supplied from the ranging module 602, and releasing the lock on the smartphone 601. Further, the operation system processing unit 622 performs a process of recognizing a gesture of the user on the basis of the depth value supplied from the ranging module 602, and then performs a process of inputting various operations in accordance with the gesture, for example.

In the smartphone 601 configured as above, the ranging module 500 described above is used as the ranging module 602, so that the distance to a predetermined object can be measured and displayed, or three-dimensional shape data of the predetermined object can be created and displayed, for example.

16. Example Applications to Moving Objects

The technology according to the present disclosure (the present technology) can be applied to various products.

For example, the technology according to the present disclosure may be embodied as an apparatus mounted on any type of moving object, such as an automobile, an electrical vehicle, a hybrid electrical vehicle, a motorcycle, a bicycle, a personal mobility device, an airplane, a drone, a vessel, or a robot.

Figure 24:
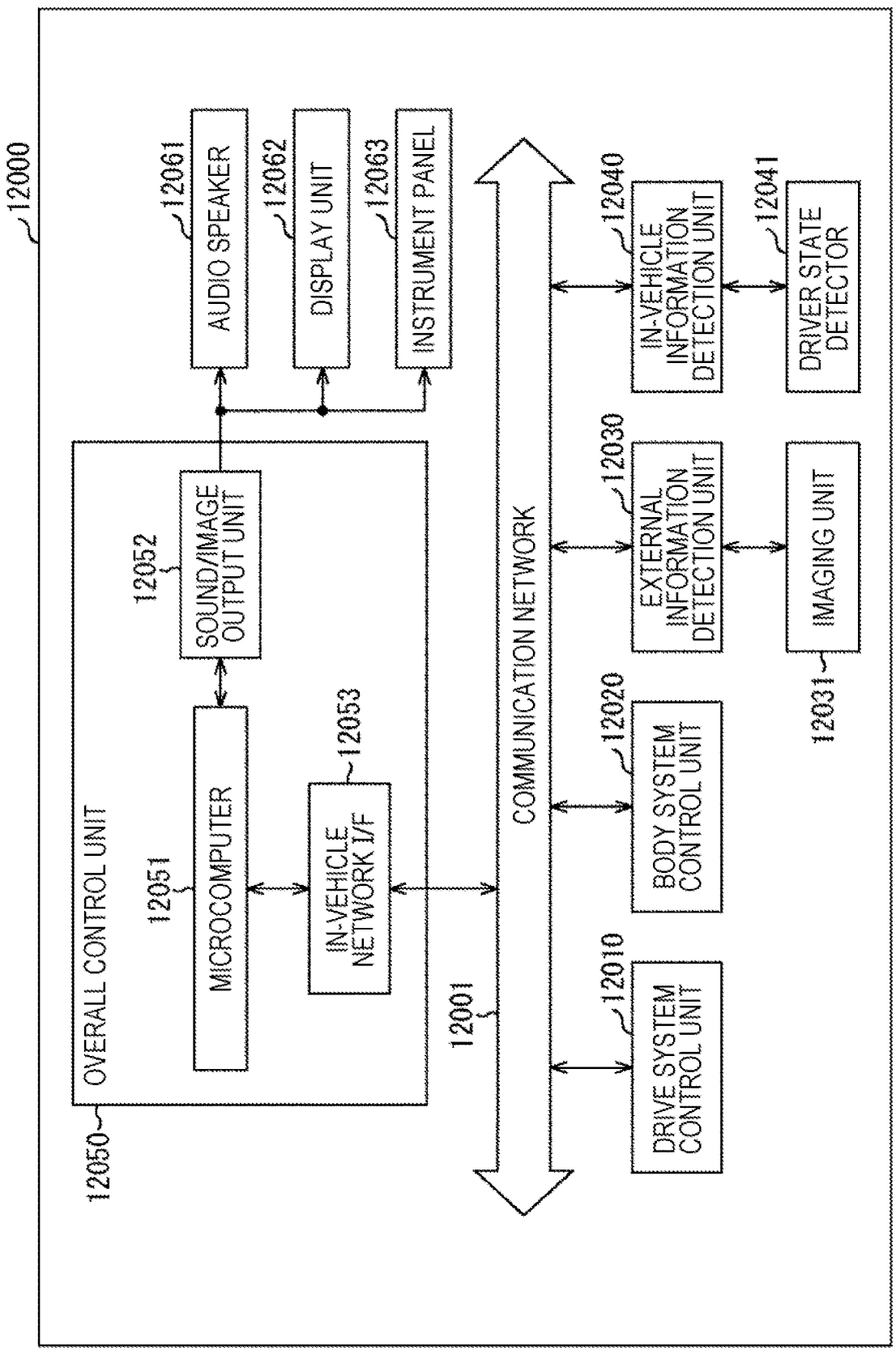
FIG. 24 is a block diagram schematically showing an example configuration of a vehicle control system.

FIG. 24 is a block diagram schematically showing an example configuration of a vehicle control system that is an example of a moving object control system to which the technology according to the present disclosure can be applied.

A vehicle control system 12000 includes a plurality of electronic control units connected via a communication network 12001. In the example shown in FIG. 24, the vehicle control system 12000 includes a drive system control unit 12010, a body system control unit 12020, an external information detection unit 12030, an in-vehicle information detection unit 12040, and an overall control unit 12050. A microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image.

In accordance with the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared light.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, in accordance with detected information input from the driver state detector 12041, the in-vehicle information detection unit 12040 may calculate the degree of fatigue or the degree of concentration of the driver, or determine whether the driver is dozing off.

In accordance with the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010.

For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

The microcomputer 12051 can also perform cooperative control to conduct automatic driving or the like for autonomously running not depending on the operation of the driver, by controlling the driving force generation device, the steering mechanism, the braking device, or the like in accordance with information about the surroundings of the vehicle, the information having being acquired by the external information detection unit 12030 or the in-vehicle information detection unit 12040.

The microcomputer 12051 can also output a control command to the body system control unit 12020, in accordance with the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 24, an audio speaker 12061, a display unit 12062, and an instrument panel 12063 are shown as output devices. The display unit 12062 may include an on-board display and/or a head-up display, for example.

Figure 25:
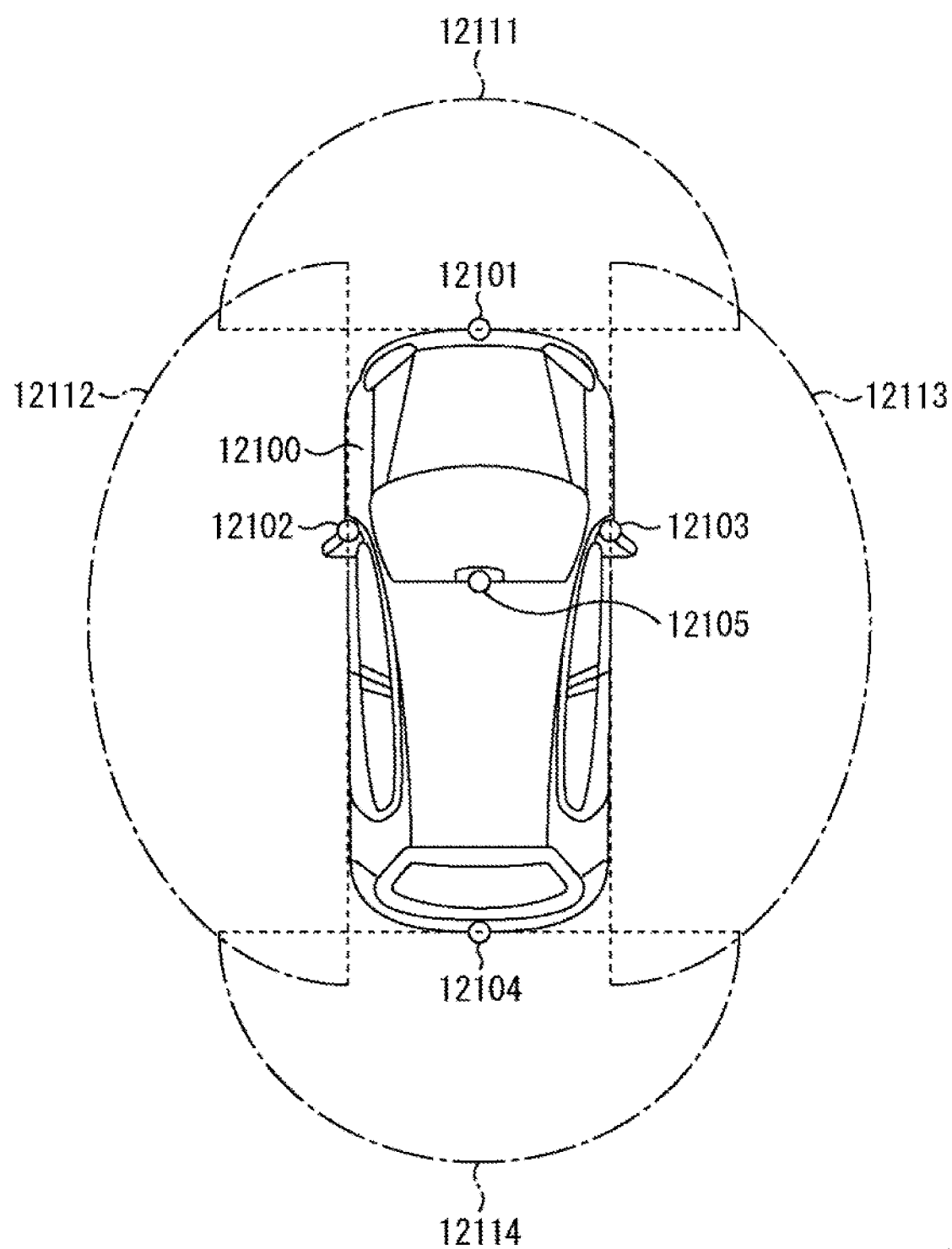
FIG. 25 is an explanatory diagram showing an example of installation positions of external information detectors and imaging units.

FIG. 25 is a diagram showing an example of installation positions of imaging units 12031.

In FIG. 25, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, and an upper portion of the front windshield inside the vehicle, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 25 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100.

Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 outputs a warning to the driver via the audio speaker 12061 and the display unit 12062, or can perform forced driving support for avoiding collision by performing forced deceleration or avoiding steering via the drive system control unit 12010.

At least one of the imaging units 12101 through 12104 may be an infrared camera that detects infrared light. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. The sound/image output unit 12052 may also control the display unit 12062 to display an icon or the like indicating the pedestrian at a desired position.

An example of a vehicle control system to which the technology according to the present disclosure can be applied has been described above. The technology according to the present disclosure can be applied to the external information detection unit 12030 and the imaging units 12031 in the above described configuration.

Specifically, the light receiving element 1 or the ranging module 500 can be applied to the distance detection processing block of the external information detection unit 12030 or the imaging unit 12031. As the technology according to the present disclosure is applied to the external information detection unit 12030 or the imaging unit 12031, the distance to an object such as a person, a car, an obstacle, a signpost, or characters on a road surface can be measured with high accuracy. With the obtained distance information, it is possible to alleviate the driver's fatigue, and enhance the safety of the driver and the vehicle.

Embodiments of the present technology are not limited to the above described embodiments, and various modifications can be made to them without departing from the scope of the present technology.

Further, in the light receiving element 1 described above, an example in which electrons are used as signal carriers has been described. However, holes generated through photoelectric conversion may also be used as signal carriers.

For example, it is possible to adopt a combination of all or some of the embodiments in the above described light receiving element 1.

Further, the advantageous effects described in this specification are merely examples, and the advantageous effects of the present technology are not limited to them and may include other effects.

Note that the present technology may also be embodied in the configurations described below.

(1)

A light receiving element including:

an on-chip lens;

a wiring layer; and a semiconductor layer disposed between the on-chip lens and the wiring layer, in which the semiconductor layer includes:

a photodiode;

a first transfer transistor that transfers electric charge generated in the photodiode to a first charge storage portion;

a second transfer transistor that transfers electric charge generated in the photodiode to a second charge storage portion; and an interpixel separation portion that separates the semiconductor layers of adjacent pixels from each other, for at least part of the semiconductor layer in the depth direction, the wiring layer has at least one layer including a light blocking member, and the light blocking member is disposed to overlap with the photodiode in a plan view.

(2)

The light receiving element according to (1), in which the interpixel separation portion penetrates the semiconductor layer in the depth direction.

(3)

The light receiving element according to (1) or (2), in which the semiconductor layer further includes:

a first additional capacitor;

a first switch transistor that connects the first additional capacitor to the first charge storage portion;

a second additional capacitor; and a second switch transistor that connects the second additional capacitor to the second charge storage portion.

(4)

The light receiving element according to (3), in which the first additional capacitor and the second additional capacitor include a wiring capacitor of the wiring layer.

(5)

The light receiving element according to (4), in which the wiring layer includes a layer in which the light blocking member is formed, and a layer in which the wiring capacitor is formed, and the wiring capacitor is formed in a layer farther from the semiconductor layer than the light blocking member.

(6)

The light receiving element according to any one of (1) to (5), in which the light blocking member includes two layers.

(7)
The light receiving element according to any one of (1) to (6), further including
an interpixel light blocking film at a pixel boundary portion of the semiconductor layer.

(8)
The light receiving element according to any one of (1) to (7),
in which a region of the semiconductor layer located above the photodiode is a moth-eye structure in which minute concavities and convexities are formed.

(9)
The light receiving element according to any one of (1) to (8),
in which the semiconductor layer is formed with a second semiconductor layer and the wiring layer that are bonded to each other, the second semiconductor layer being another semiconductor layer, and
the second semiconductor layer includes at least an amplification transistor and a selection transistor.

(10)
A ranging module including:
a light receiving member;
a light source that emits irradiation light having periodically varying brightness; and
a light emission controller that controls timing to emit the irradiation light,
in which the light receiving element includes:
an on-chip lens;
a wiring layer; and
a semiconductor layer disposed between the on-chip lens and the wiring layer,
the semiconductor layer includes:
a photodiode;
a first transfer transistor that transfers electric charge generated in the photodiode to a first charge storage portion;
a second transfer transistor that transfers electric charge generated in the photodiode to a second charge storage portion; and
an interpixel separation portion that separates the semiconductor layers of adjacent pixels from each other, for at least part of the semiconductor layer in the depth direction,
the wiring layer has at least one layer including a light blocking member, and
the light blocking member is disposed to overlap with the photodiode in a plan view.

(11)
An electronic apparatus including:
a ranging module including:
a light receiving member;
a light source that emits irradiation light having periodically varying brightness; and
a light emission controller that controls timing to emit the irradiation light,
in which the light receiving element includes:
an on-chip lens;
a wiring layer; and
a semiconductor layer disposed between the on-chip lens and the wiring layer,
the semiconductor layer includes:
a photodiode;
a first transfer transistor that transfers electric charge generated in the photodiode to a first charge storage portion;
a second transfer transistor that transfers electric charge generated in the photodiode to a second charge storage portion; and
an interpixel separation portion that separates the semiconductor layers of adjacent pixels from each other, for at least part of the semiconductor layer in the depth direction,
the wiring layer has at least one layer including a light blocking member, and
the light blocking member is disposed to overlap with the photodiode in a plan view.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Light receiving element
10 Pixel
PD Photodiode
RST Reset transistor
SEL Selection transistor
TRG Transfer transistor
FD Floating diffusion region
FDG Switch transistor
FDL Additional capacitor
M Metal film
MEM Memory
OFG Charge ejection transistor
21 Pixel array unit
41 Semiconductor substrate (first substrate)
42 Multilayer wiring layer
43 Antireflective film
44 Pixel boundary portion (boundary portion)
45 Interpixel light blocking film
47 On-chip lens
61 Interpixel separation portion
63 Light blocking member (reflective member)
64 Wiring capacitor
211 Interpixel separation portion
221 Antireflective film
223 PD upper region
301 Semiconductor substrate (second substrate)
321 Multilayer wiring layer
500 Ranging module
511 Light emitting unit
512 Light emission controller
513 Light receiving unit
601 Smartphone
602 Ranging module

What is claimed is:
1. A light receiving element, comprising:
an on-chip lens;
a multilayer wiring layer; and
a semiconductor layer disposed between the on-chip lens and the multilayer wiring layer,
wherein the semiconductor layer includes:
a photodiode;
first and second trench portions disposed in the semiconductor layer, wherein the photodiode is disposed between the first and second trench portions in a cross-sectional view;
a plurality of concavities and convexities on a surface of the semiconductor layer between the photodiode and the on-chip lens, and wherein the concavities and convexities of the plurality of concavities and convexities are disposed between the first and second trench portions in the cross-sectional view;

a first transfer transistor that transfers electric charge from the photodiode to a first charge storage portion; and a second transfer transistor that transfers electric charge from the photodiode to a second charge storage portion, and wherein the photodiode is disposed between the first transfer transistor and the second transfer transistor in the cross-sectional view.

2. The light receiving element of claim 1, wherein the concavities and convexities are disposed in a lattice form in a plan view.

3. The light receiving element of claim 1, further comprising:
an antireflection film, wherein the antireflection film is disposed on a surface of the concavities and convexities.

4. The light receiving element of claim 1, wherein the multilayer wiring layer includes a plurality of elements, wherein at least one of the elements is a continuous element, and wherein the photodiode is between the continuous element and the concavities and convexities.

5. The light receiving element of claim 4, wherein the continuous element extends from adjacent the first transfer transistor to adjacent the second transfer transistor.

6. The light receiving element of claim 1, wherein the first transfer transistor selectively connects the photodiode to a first floating diffusion region, and wherein the second transfer transistor selectively connects the photodiode to a second floating diffusion region.

7. The light receiving element of claim 6, wherein the multilayer wiring layer includes a first wiring connected to a first gate electrode of the first transfer transistor, and wherein the wiring layer includes a second wiring connected to a second gate electrode of the second transfer transistor.

8. The light receiving element of claim 7, wherein the multilayer wiring layer further includes a continuous element, wherein the continuous element extends from adjacent the first wiring to adjacent the second wiring.

9. The light receiving element of claim 8, wherein the first wiring, the second wiring, and the continuous element are disposed in a first wiring layer of the multilayer wiring.

10. The light receiving element of claim 9, wherein the first wiring layer of the multilayer wiring layer is closer to the photodiode than any other wiring layer of the multilayer wiring layer.

11. The light receiving element of claim 4, wherein the continuous element is a barrier to infrared light.

12. The light receiving element of claim 4, wherein the continuous element reflects infrared light.

13. The light receiving element of claim 4, wherein the continuous element overlaps at least a portion of the photodiode in a plan view.

14. The light receiving element according to claim 1, further comprising:
an interpixel light blocking film at a pixel boundary portion of the semiconductor layer.

15. The light receiving element according to claim 1, wherein the concavities and convexities is a moth-eye structure.

16. The light receiving element according to claim 15, wherein the moth-eye structure includes a plurality of concavities.

17. The light receiving element according to claim 15, wherein the moth-eye structure includes a plurality of convexities.

18. The light receiving element according to claim 15, wherein the moth-eye structure includes a plurality of concavities and convexities.

* * * * *